(12) United States Patent
Kim et al.

(10) Patent No.: US 11,056,485 B2
(45) Date of Patent: Jul. 6, 2021

(54) SEMICONDUCTOR DEVICE HAVING THREE-DIMENSIONAL STRUCTURE AND METHOD OF MANUFACTURING THE SAME

(71) Applicant: SK hynix Inc., Icheon-si (KR)

(72) Inventors: Hae Ri Kim, Icheon-si (KR); Tae Jun You, Cheongju-si (KR); Ju Ry Song, Suwon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 16/595,379

(22) Filed: Oct. 7, 2019

(65) Prior Publication Data
US 2020/0194426 A1    Jun. 18, 2020

(30) Foreign Application Priority Data

Dec. 18, 2018    (KR) .................. 10-2018-0164173

(51) Int. Cl.
| | |
|---|---|
| H01L 27/06 | (2006.01) |
| H01L 21/3205 | (2006.01) |
| H01L 21/28 | (2006.01) |
| H01L 29/66 | (2006.01) |
| H01L 27/102 | (2006.01) |
| H01L 27/105 | (2006.01) |
| H01L 29/40 | (2006.01) |
| H01L 21/822 | (2006.01) |

(52) U.S. Cl.
CPC .... *H01L 27/0688* (2013.01); *H01L 21/28088* (2013.01); *H01L 21/32051* (2013.01); *H01L 21/32055* (2013.01); *H01L 21/8221* (2013.01); *H01L 27/1027* (2013.01); *H01L 27/1052* (2013.01); *H01L 29/401* (2013.01); *H01L 29/66363* (2013.01)

(58) Field of Classification Search
CPC ............ H01L 27/0814; H01L 27/0688; H01L 29/66121
See application file for complete search history.

(56) References Cited

U.S. PATENT DOCUMENTS

| | | | |
|---|---|---|---|
| 8,980,699 B2 | 3/2015 | Tang | |
| 2006/0278869 A1* | 12/2006 | Hioki | H01L 51/424 257/40 |
| 2008/0203535 A1* | 8/2008 | Noda | H01L 29/0834 257/579 |
| 2010/0159649 A1* | 6/2010 | Parthasarathy | H01L 29/66333 438/138 |
| 2012/0074459 A1* | 3/2012 | Ogura | H01L 29/0696 257/139 |
| 2014/0131710 A1* | 5/2014 | Chung | H01L 29/6609 257/49 |

(Continued)

*Primary Examiner* — Zandra V Smith
*Assistant Examiner* — John M Parker

(57) ABSTRACT

A semiconductor device having a three-dimensional structure is disclosed herein. The semiconductor device includes a substrate. a first electrode line that extends in a first direction perpendicular to the substrate, a device pattern that extends from the first electrode line in a second direction parallel to the substrate, and a second electrode line connected to the device pattern. The device pattern may comprise at least one semiconductor layer pattern, where the at least one semiconductor layer pattern comprises an n-type dopant or a p-type dopant.

14 Claims, 32 Drawing Sheets

(56) References Cited

U.S. PATENT DOCUMENTS

2016/0172352 A1* 6/2016 Schulze .............. H01L 29/7397
                                                         257/104
2017/0352665 A1* 12/2017 Luan ................... H01L 27/1052
2018/0053766 A1   2/2018 Luan et al.

* cited by examiner

SEMICONDUCTOR DEVICE HAVING THREE-DIMENSIONAL STRUCTURE AND METHOD OF MANUFACTURING THE SAME

CROSS-REFERENCE TO RELATED APPLICATION

The present application claims priority under 35 U.S.C 119(a) to Korean Patent Application No. 10-2018-0164173, filed on Dec. 18, 2018, which is herein incorporated by reference in its entirety.

BACKGROUND

1. Technical Field

Various embodiments of the present disclosure generally relate to a semiconductor device and, more particularly, to a semiconductor device having a three-dimensional structure and a method of manufacturing the same.

2. Related Art

As design rules decrease and the degree of integration increases, researches on the structure of semiconductor devices that can guarantee both the structural stability and the operational reliability of such semiconductor devices have continued. Specifically, researches to realize a three-dimensional structure of an array of switching devices or memory devices having a plurality of cells with greater structural stability and operational reliability have continued.

SUMMARY

One embodiment of the present disclosure provides a semiconductor device having a three-dimensional structure. The semiconductor device includes a substrate, a first electrode line extending in a first direction perpendicular to the substrate, a device pattern extending from the first electrode line in a second direction parallel to the substrate, and a second electrode line connected to the device pattern. The device pattern includes at least one semiconductor layer pattern, and the semiconductor layer pattern includes an n-type dopant or a p-type dopant.

Another embodiment of the present disclosure provides a semiconductor device having a three-dimensional structure. The semiconductor device includes a substrate, first electrode lines extending in a first direction perpendicular to the substrate, device patterns and interlayer insulating layers, which are alternately stacked on the substrate in the first direction, and second electrode lines disposed on the same plane as the device patterns. The device patterns extend from the first electrode line in a second direction parallel to the substrate and are connected to the second electrode lines, the device pattern including at least one doped semiconductor layer pattern.

DETAILED DESCRIPTION

Figure 1:
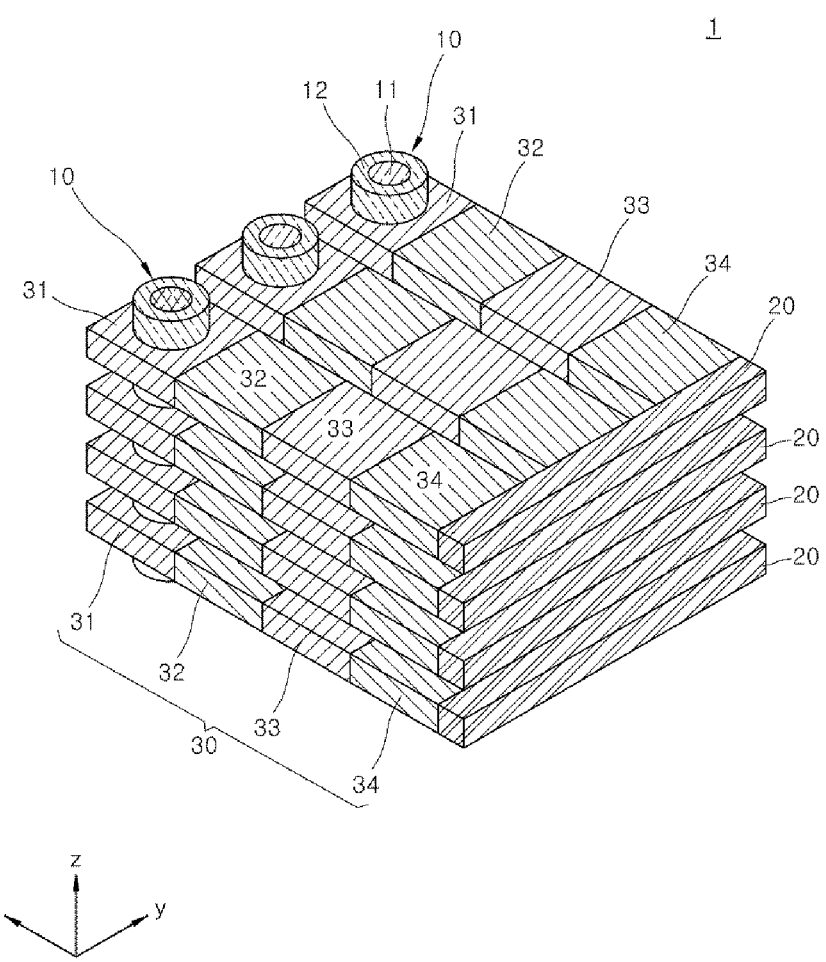
FIG. 1 is a schematic view illustrating a semiconductor device having a three-dimensional structure according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, it may be understood that the element is directly located on the other element, or an additional element may be interposed between the element and the other element. The same reference numerals refer to the same elements throughout the specification.

In the drawings, the shapes of the constituent elements are shown in the form of a circle, a cylinder, a quadrangular prism, a rectangular parallelepiped or the like in order to more clearly show the spirit of the disclosure, but the disclosure is not limited thereto. Various modifications may be possible as long as that are maintained. For example, a circle, a cylinder, and the line can be deformed into an ellipse, an ellipse pillar, or the like, and can be implemented with various polygonal columns or polygonal shapes.

In addition, expression of a singular form of a word should be understood to include the plural forms of the word unless clearly used otherwise in the context. It will be understood that the terms "comprise" or "have" are intended to specify the presence of a feature, a number, a step, an operation, an element, a part, or combinations thereof, but not used to preclude the presence or possibility of addition one or more other features, numbers, steps, operations, components, parts, or combinations thereof. Further, in performing a method or a manufacturing method, each process constituting the method can take place differently from the stipulated order unless a specific sequence is described explicitly in the context. In other words, each process may be performed in the same manner as stated order, may be performed substantially at the same time, or may be performed in a reverse order.

Figure 2:
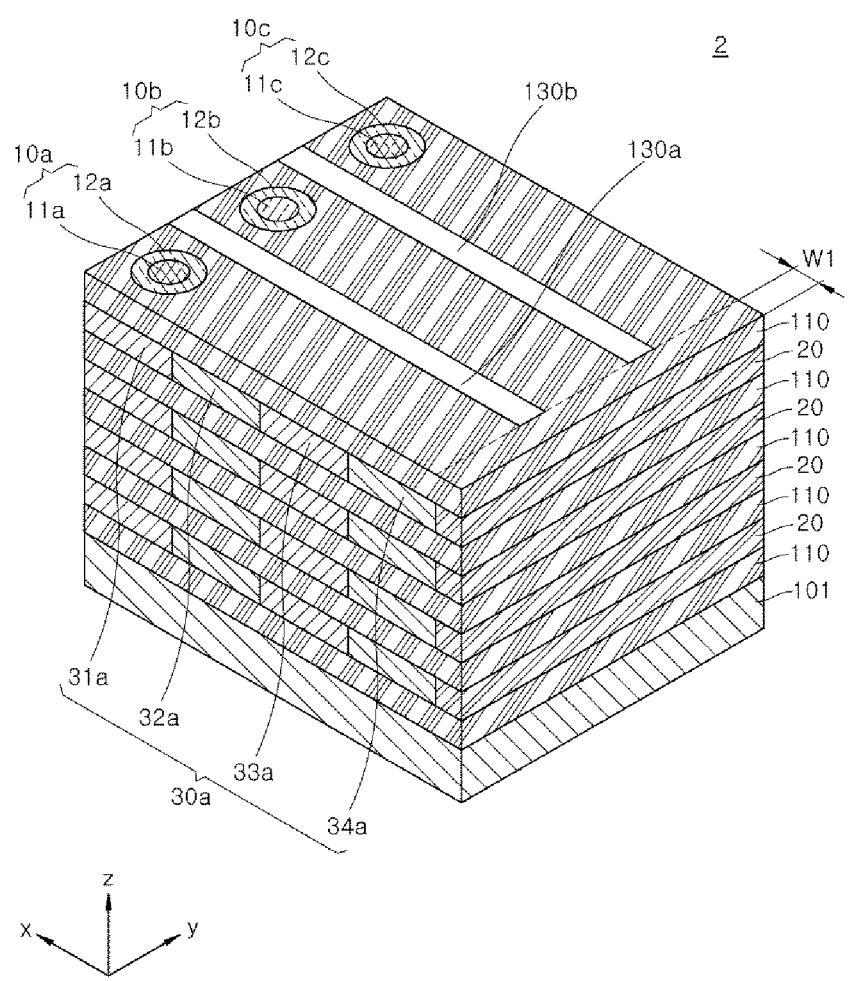
FIG. 2 is a perspective view schematically illustrating a semiconductor device having a three-dimensional structure according to an embodiment of the present disclosure.
Figure 3:
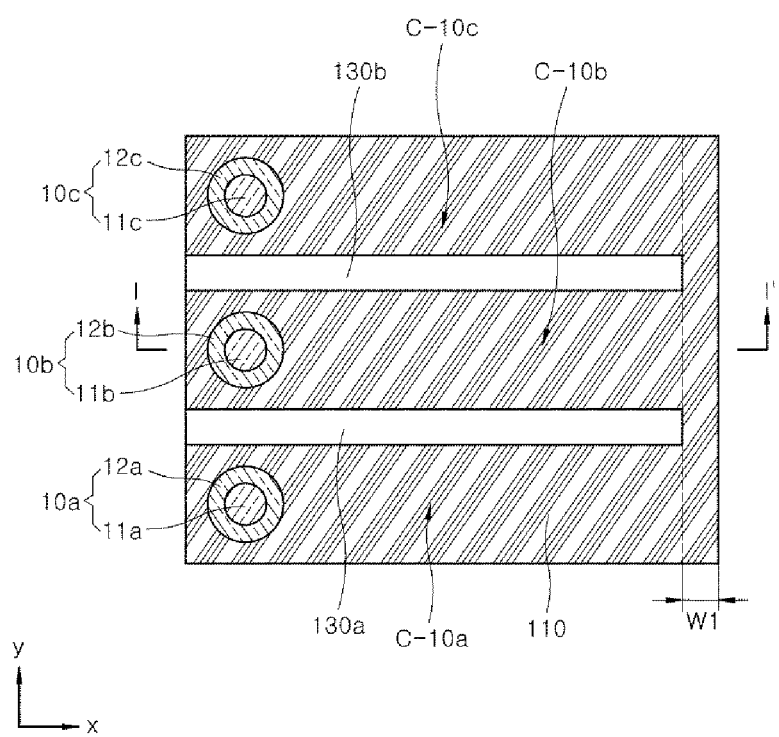
FIG. 3 is a plan view schematically illustrating the semiconductor device of FIG. 2.
Figure 4:
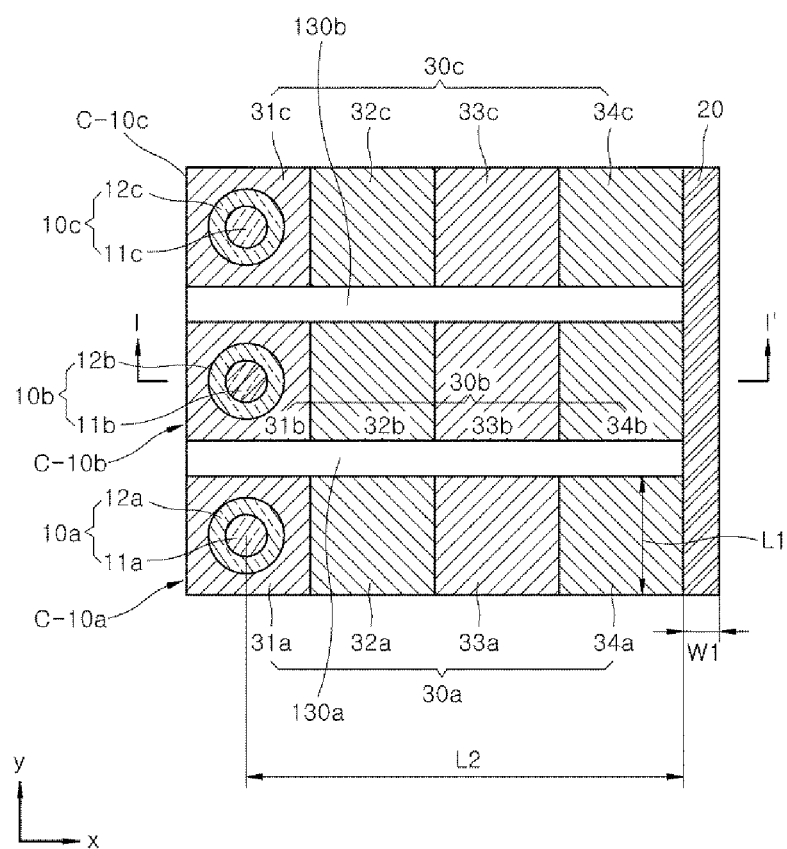
FIG. 4 is a planar perspective view schematically illustrating the semiconductor device of FIG. 2 when the uppermost interlayer insulating layer is omitted.
Figure 9:
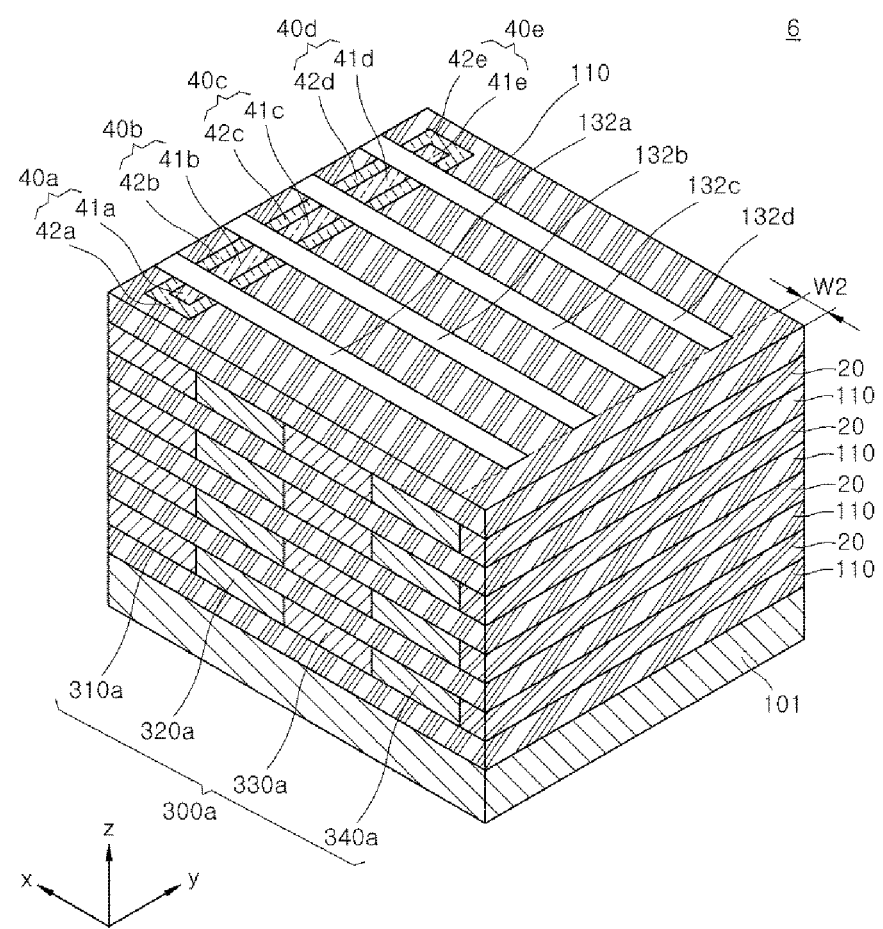
FIG. 9 is a perspective view schematically illustrating a semiconductor device having a three-dimensional structure according to another embodiment of the present disclosure.
Figure 10:
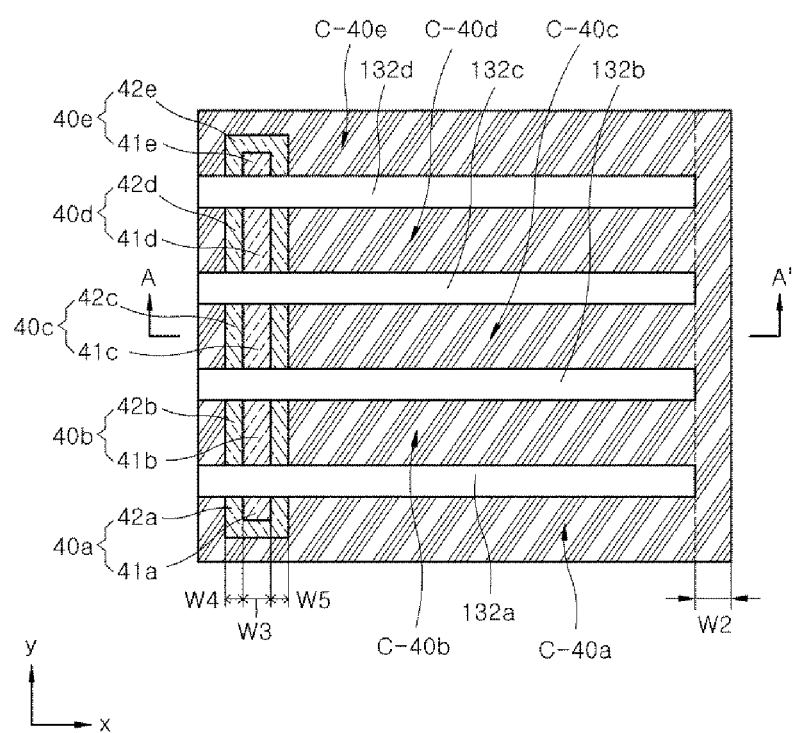
FIG. 10 is a plan view of the semiconductor device of FIG. 9.
Figure 11:
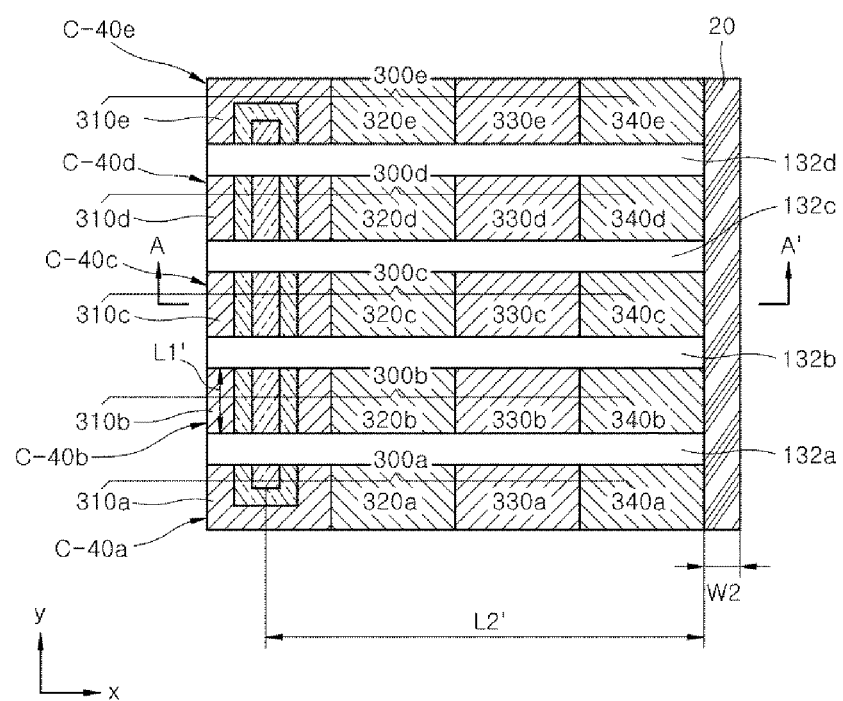
FIG. 11 is a planar perspective view of the semiconductor device of FIG. 9 when the uppermost interlayer insulating layer is omitted.

In this specification, the term "planar perspective views" as used herein means plan views of, for example, semiconductor devices to be described herein and in accordance with various embodiments of the present disclosure. For example, FIG. 2 illustrates a semiconductor device 2 in accordance with various embodiments. FIG. 3, in contrast, is a planar perspective view (i.e., plan view) of the semiconductor device 2 of FIG. 2, while FIG. 4 is a planar perspective view of the same semiconductor device 2 after the uppermost interlayer insulating layer 110 is removed from the semiconductor device 2. Similarly, FIG. 9 illustrates another semiconductor device 6 in accordance with various embodiments. FIG. 10, in contrast, is a planar perspective view (i.e., plan view) of the semiconductor device 6 of FIG. 9, while FIG. 11 is a planar perspective view of the same semiconductor device 6 after the uppermost interlayer insulating layer 110 is removed from the semiconductor device 6.

FIG. 1 is a schematic view of a semiconductor device 1 having a three-dimensional structure according to an embodiment of the present disclosure. In an embodiment, the semiconductor device 1 may include first electrode lines 10, second electrode lines 20, and device patterns 30 disposed between the first and second electrode lines 10 and 20. For the convenience of explanation, substrate and insulation layers, such as insulating layer 110 and insulating pattern 130 included in semiconductor device 2 of FIGS. 2 to 5, are omitted in FIG. 1.

The first electrode lines 10 may be disposed to extend in a first direction, for example, z-direction. The first direction, for example, the z-direction in which the first electrode lines 10 extend may be perpendicular to a plane where the device patterns 30 are disposed. More particularly, the plane may be defined by longitudinal directions (i.e., x-direction and y-direction) of the layer of the semiconductor device 1 where the device patterns 30 (which comprises semiconductor layer patterns 31, 32, 33, and 34) are disposed. Note that semiconductor device 1 includes multiple layers as illustrated in FIG. 1 (e.g., FIG. 1 shows four layers), and each layer corresponding to a different plane. The second electrode lines 20 may be connected to the device patterns 30 and extend to a second direction, for example, x-direction and a third direction, for example, y-direction on the plane where the device patterns 30 are disposed.

The first electrode lines 10 may be arranged to be spaced apart from each other by a predetermined distance along the third direction, for example, y-direction. In FIG. 1, although only three first electrode lines 10 are illustrated for the convenience of explanation, the number of the first electrode lines 10 is not limited. The first electrode lines 10 may each include an electrode structure. As an example, the electrode structure may have an inner pillar structure 11 and an outer wall layer 12. The inner pillar structure 11 may include a conductive material having a lower resistivity than the outer wall layer 12. For an example, the inner pillar structure 11 may include tungsten (W), titanium (Ti), molybdenum (Mo), cobalt (Co), ruthenium (Ru), copper (Cu), aluminum (Al), tungsten nitride, titanium nitride, tantalum nitride, tungsten silicide, titanium silicide, tantalum silicide or the like.

The outer wall layer 12 may include a semiconductor material. As will be described later, the outer wall layer 12 can function as a seed layer on which the device pattern 30 is epitaxially grown. The outer wall layer 12 may include, for example, silicon (Si), gallium arsenic (GaAs), germanium (Ge), gallium nitride (GN) or the like, but it is not limited thereto. The outer wall layer 12 may include various compounds of 2 or 3 or more elements. The outer wall layer 12 may include intrinsic semiconductor. Alternatively, the outer wall layer 12 may include n-type or p-type doped semiconductor.

The device patterns 30, which includes semiconductor layer patterns 31, 32, 33, and 34, may be connected to side surfaces of the first electrode lines 10, and a plurality of device patterns 30 may be arranged or spaced apart from each other along the first direction, for example, z-direction. The plurality of device patterns 30 may each constitute device cells, respectively. Referring to FIG. 1 again, since the plurality of first electrode lines 10 are arranged along the third direction, for example, y-direction, the plurality of device patterns 30 extending from the first electrode lines 10 may be arranged apart from each other along the third direction, for example, y-direction at the same height (e.g., in FIG. 1 there are three parallel device patterns 30 in the upper most layer).

The device patterns 30 may each include at least one semiconductor layer pattern. Although first, second, third, and fourth semiconductor layer patterns 31, 32, 33, and 34 are illustrated as an example in FIG. 1, the number of the semiconductor layer pattern is not necessarily limited to a specific number. The at least one semiconductor layer pattern may include an n-type dopant or a p-type dopant.

In an embodiment, as illustrated in FIG. 1, the first, second, third and fourth semiconductor layer patterns 31, 32, 33 and 34 may be semiconductor layer patterns that have been doped to form p-type, n-type, p-type and n-type semiconductor layer patterns, respectively. In this case, the device pattern 30 has a pnpn junction structure. Alternatively, the first, second, third and fourth semiconductor layer patterns 31, 32, 33 and 34 may be semiconductor layer patterns that have been doped to form n-type, p-type, n-type and p-type semiconductor layer patterns, respectively. In this case, the device pattern 30 has an npnp junction structure.

The device pattern 30 having the pnpn junction structure or the npnp junction structure may function as a two-terminal thyrister-type memory device. The two-terminal thyrister-type memory device can store signals using a feature that an output current exhibits a hysteresis characteristic depending on an applied drive voltage.

Referring to FIG. 1 again, the second electrode lines 20 extending in the third direction, for example, y-direction may be arranged in a plural number along the first direction, for example, z-direction. (e.g., FIG. 1 shows four electrode lines 20, each extending in the third direction (e.g., y-direction) and spaced apart in the first direction (e.g., z-direction). Each second electrode lines 20 may be connected to a plurality of device patterns 30 that are disposed on the same plane that the second electrode line 20 is disposed on. The second electrode lines 20 may be conductive layer patterns. The second electrode lines 20 may each include tungsten (W), titanium (Ti), molybdenum (Mo), cobalt (Co), ruthenium (Ru), copper (Cu), aluminum (Al), tungsten nitride, titanium nitride, tantalum nitride, tungsten silicide, titanium silicide, tantalum silicide or the like.

Figure 5:
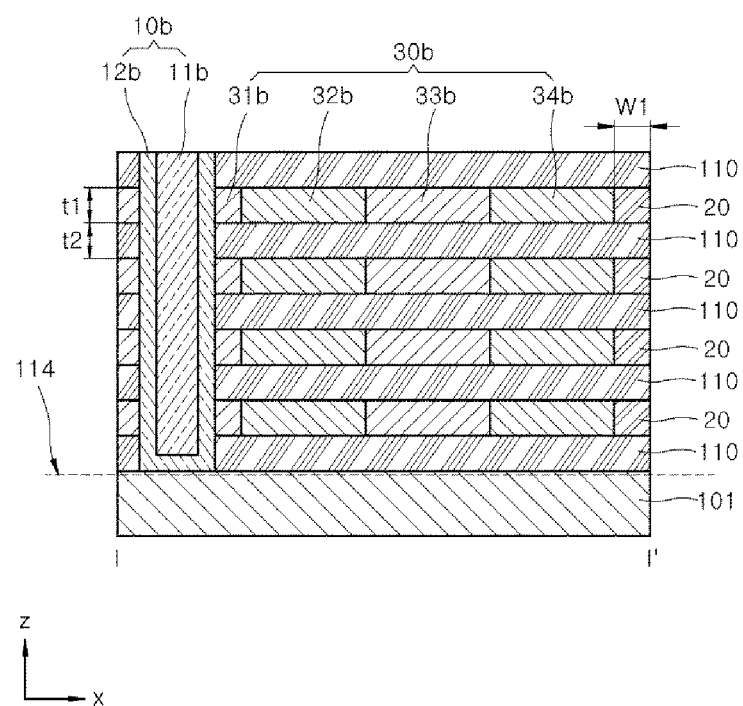
FIG. 5 is a cross-sectional view taken along the line I-I' in the plan view of FIG. 3 and the planar perspective view of FIG. 4.

FIG. 2 is a view schematically illustrating a semiconductor device 2 having a three-dimensional structure according to an embodiment of the present disclosure. FIG. 3 is a plan view schematically illustrating the semiconductor device 2 of FIG. 2 according to an embodiment of the present disclosure. FIG. 4 is a planar perspective view schematically illustrating the semiconductor device 2 when the uppermost interlayer insulating layer 110 is omitted from the semiconductor device 2. FIG. 5 is a cross-sectional view taken along the line I-I' in the planar perspective view of FIG. 3 and the planar perspective view of FIG. 4.

FIGS. 3-5 illustrate different cross-sectional views (e.g., FIGS. 4 and 5) as well as a plan view (FIG. 0.3) of semiconductor device 2 of FIG. 2. The semiconductor device 2, as illustrated in FIG. 2, includes a substrate 101 disposed at the bottom of the semiconductor device 2. More particularly, the semiconductor device 2 may include the substrate 101, first electrode lines 10a, 10b and 10c, device patterns 30a, 30b and 30c, insulating layers 110, and second electrode lines 20. The device patterns 30a, 30b and 30c (see FIG. 4) may each be electrically insulated from each other by insulating patterns 130a and 130b. The device patterns 30a, 30b and 30c, illustrated in FIG. 4, may be connected to the same second electrode line 20. In the planar perspective view of FIG. 4, the device patterns 30a, 30b and 30c and the second electrode lines 20 located inside the semiconductor device 2 are shown by removing the uppermost insulating layer 110.

in various embodiments, the substrate 101 of FIGS. 2-5 may be, for example, a silicon (Si) substrate, a gallium arsenic (GaAs) substrate, an indium phosphide (InP) substrate, a germanium (Ge) substrate, or a silicon germanium (SiGe) substrate. In some embodiments, the substrate 101 may be a doped substrate, such as an n-type or p-type substrate having conductivity. In some embodiments, the substrate 101 may be an insulative substrate like a silicon-on-insulator (SOI) substrate. In some embodiments, the substrate 101 may be a conductive substrate like a metal substrate. In various embodiments, substrate 101 may define a substrate plane 114 (e.g., a virtual plane). The substrate plane 114 may extend in the longitudinal directions (e.g., x-direction and y-direction) of the substrate 101—thus the substrate plane may be parallel to or may be the plane formed by the longitudinal directions of the substrate 101.

The first electrode lines 10a, 10b and 10c may be disposed on the substrate 101 to extend in a first direction, for example, z-direction perpendicular to the substrate 101 (e.g., perpendicular to the substrate plane 114 defined by the substrate 101). The first electrode lines 10a, 10b and 10c may be formed to penetrate the insulating layers 110 and the device patterns 30a, 30b and 30c. That is, the insulating layers 110 and the device patterns 30a, 30b and 30c may be disposed to surround the first electrode lines 10a, 10b and 10c along the first direction, for example, z-direction. The first electrode lines 10a, 10b and 10c may each be arranged apart from each other along a third direction, for example, y-direction parallel to the substrate 101.

The first electrode lines 10a, 10b and 10c may each include electrode structures. The electrode structures may include inner pillar structures 11a, 11b and 11c and outer wall layers 12a, 12b and 12c. The configurations of the inner pillar structures 11a, 11b and 11c and outer wall layers 12a, 12b and 12c may be substantially the same as the configurations of the inner pillar structure 11 and outer wall layer 12 of the first electrode line 10 described above with reference to FIG. 1.

Referring to FIG. 2 again, the interlayer insulating layers 110 and the device patterns 30a, 30b and 30c may be alternately stacked on the substrate 101 along the first direction, for example, z-direction. The interlayer insulating layers 110 may include oxide or nitride. More specifically, the interlayer insulation layers 110 may each include, for example, silicon oxide, silicon nitride or silicon oxynitride. The interlayer insulating layers 110 may insulate the device patterns 30a, 30b and 30c from each other along the first direction, for example, z-direction. Accordingly, the device patterns 30a, 30b and 30c may be disposed in a space between the interlayer insulating layers 110 along the first direction, for example, z-direction.

Referring to FIG. 4, the device patterns 30a, 30b and 30c may be separated from each other with respect to the third direction, for example, y-direction by the insulating patterns 130a and 130b. Accordingly, the device patterns 30a, 30b and 30c can constitute device cells C-10a, C-10b and C-10c that are electrically separated from each other on the same plane. That is, the device cells C-10a, C-10b and C-10c, which may correspondingly include the device patterns 30a, 30b and 30c, respectively, may be coupled to first electrode lines 10a, 10b, and 10c, respectively, and may be coupled to a single second electrode line 20.

The device cells C-10a, C-10b and C-10c may each have a width L1 along the third direction, for example, y-direction and a length L2 along the second direction, for example, x-direction. The width L1 may, for example, be about 5 to 300 nanometers (nm). The width L1 may mean the width of the device patterns 30a, 30b and 30c located between and adjacent to the insulating patterns 130a and 130b. The length L2 may, for example, be about 50 to 1000 nanometers (nm). The length L2 may be the length from the center of each of the inner pillar structures 11a, 11b and 11c to the corresponding second electrode lines 20 along the second direction, for example, x-direction. Referring to FIGS. 4 and 5 together, the device cells C-10a, C-10b and C-10c may each have a thickness t1 and a spacing t2 along the first direction, e.g., the z-direction. The thickness t1 may, for example, be 5 to 300 nanometers (nm). The spacing t2 may correspond to the thickness of the interlayer insulating layer 110. The spacing t2 may, for example, be 5 to 300 nanometers (nm).

The device patterns 30a, 30b and 30c may include first semiconductor layer patterns 31a, 31b and 31c, second semiconductor layer patterns 32a, 32b and 32c, third semiconductor layer patterns 33a, 33b and 33c, and fourth semiconductor layer patterns 34a, 34b and 34c that are sequentially disposed from the first electrode lines 10a, 10b and 10c along the second direction, for example, x-direction parallel to the substrate 101 and perpendicular to the third direction, for example, y-direction.

In an embodiment, the first semiconductor layer patterns 31a, 31b and 31c may have been doped to form p-type semiconductor layer patterns, the second semiconductor layer patterns 32a, 32b and 32c may have been doped to form n-type semiconductor layer patterns, the third semiconductor layer patterns 33a, 33b and 33c may have been doped to form p-type semiconductor layer patterns, and the fourth semiconductor layer patterns 34a, 34b and 34c may have been doped to form n-type semiconductor layer patterns. Accordingly, the first semiconductor layer patterns 31a, 31b and 31c, the second semiconductor layer patterns 32a, 32b and 32c, the third semiconductor layer patterns 33a, 33b and 33c, and the fourth semiconductor layer patterns 34a, 34b and 34c may form multiple pnpn junctions, which in this case are three pnpn junctions.

In another embodiment, the first semiconductor layer patterns 31a, 31b and 31c may have been doped to form n-type semiconductor layer patterns, the second semiconductor layer patterns 32a, 32b and 32c may have been doped to form p-type semiconductor layer patterns, the third semiconductor layer patterns 33a, 33b and 33c may have been doped to form n-type semiconductor layer patterns, and the fourth semiconductor layer patterns 34a, 34b and 34c may have been doped to form p-type semiconductor layer patterns. Accordingly, the first semiconductor layer patterns 31a, 31b and 31c, the second semiconductor layer patterns 32a, 32b and 32c, the third semiconductor layer patterns 33a, 33b and 33c, and the fourth semiconductor layer patterns 34a, 34b and 34c may form multiple npnp junctions, which in this case are three npnp junctions.

The device patterns 30a, 30b and 30c may function as a two-terminal thyristor-type memory device. The thyristor-type memory device can store signals using the feature that an output current exhibits a hysteresis characteristic depending on an applied drive voltage.

The insulating patterns 130a and 130b and the interlayer insulating layers 110 along the first direction, for example, z-direction may be disposed on the substrate 101 to electrically insulate or isolate the device patterns 30a, 30b and 30c. The insulating patterns 130a and 130b may extend along the second direction, for example, x-direction. The insulating patterns 130a and 130b may each include oxide or nitride. More specifically, the insulating patterns 130a and 130b may, for example, include silicon oxide, silicon nitride or silicon oxynitride.

The second electrode lines 20 (e.g., the semiconductor device 2 of FIG. 2 includes four second electrode lines 20) may extend in the third direction, for example, y-direction perpendicular to the second direction, for example, x-direction on the same plane as the device patterns 30a, 30b and 30c. Each of the second electrode lines 20 may be connected to the device patterns 30a, 30b and 30c, respectively. As an example, the second electrode lines 20 may be connected to the fourth semiconductor layer patterns 34a, 34b and 34c of the structure patterns 30a, 30b and 30c. In other words, each second electrode line 20 may be connected to the device cells C-10a, C-10b and C-10c. Referring to FIGS. 3 to 5, the second electrode lines 20 may each have a predetermined width W1 from an end of each of the fourth semiconductor layer patterns 34a, 34b, and 34c.

Figure 6:
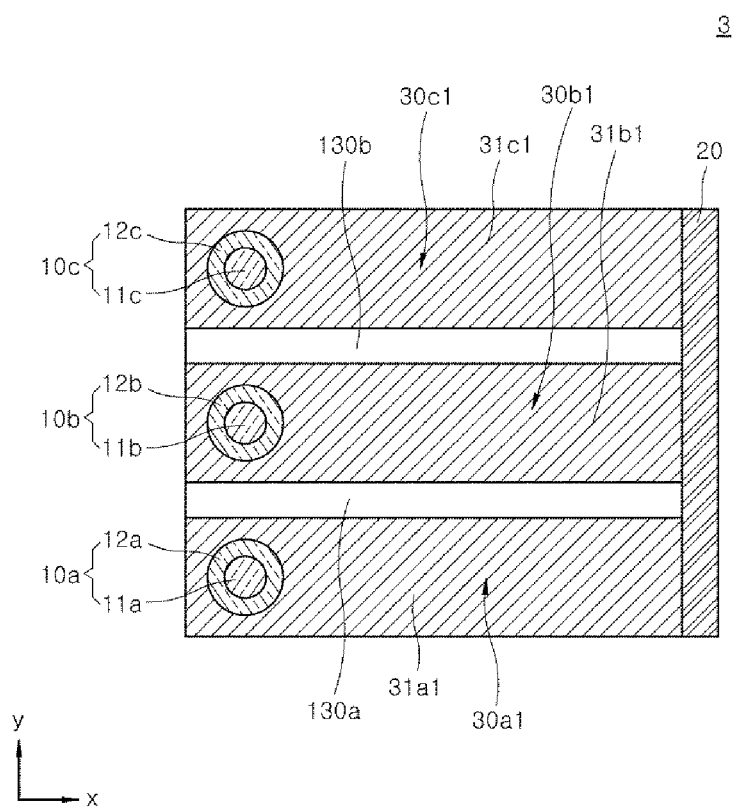
FIG. 6 is a planar perspective view of a semiconductor device having a three-dimensional structure according to another embodiment of the present disclosure.

FIG. 6 is a planar perspective view (i.e., plan view) of a semiconductor device 3 having a three-dimensional structure according to another embodiment of the present disclosure. Referring to FIG. 6, the configuration of the semiconductor device 3 is substantially the same as that of the semiconductor device 2 of FIGS. 2 to 5, except the configurations of the device patterns 30a1, 30b1 and 30c1

In this embodiment, the device patterns 30a1, 30b1 and 30c1 may have single semiconductor layer patterns 31a1, 31b1, 31c1 between first electrode lines 10a, 10b and 10c and a second electrode line 20, respectively. The semiconductor layer patterns 31a1, 31b1 and 31c1 may each be doped to form p-type or n-type semiconductor layer patterns. Accordingly, the device patterns 30a1, 30b1 and 30c1 may form diode device patterns by a Schottky junction with the first electrode lines 10a, 10b and 10c or may form diode device patterns by a Schottky junction with the second electrode lines 20.

Figure 7:
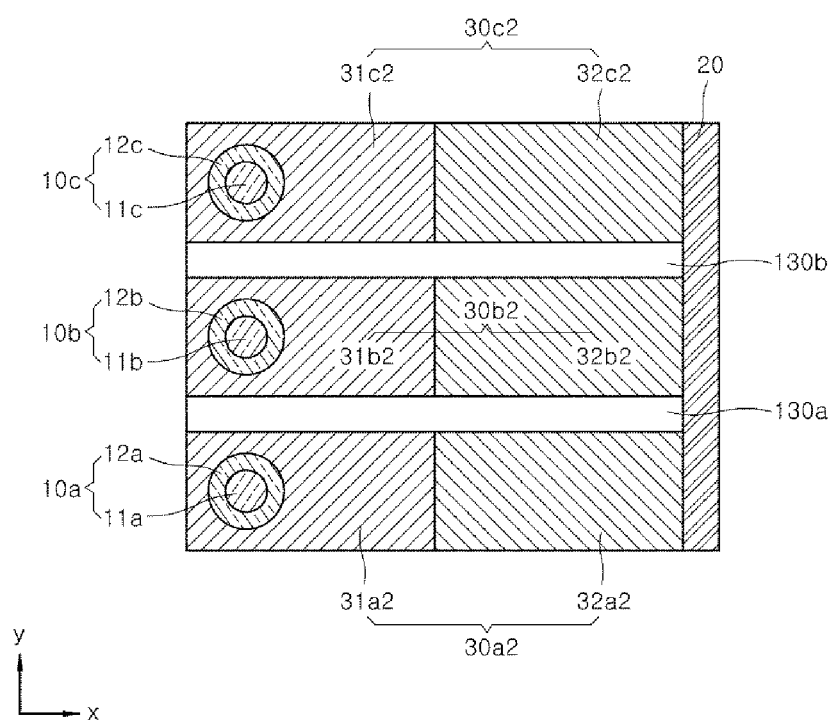
FIG. 7 is a planar perspective view of a semiconductor device having a three-dimensional structure according to yet another embodiment of the present disclosure.

FIG. 7 is a planar perspective view a semiconductor device 4 having a three-dimensional structure according to yet another embodiment of the present disclosure. Referring to FIG. 7, the configuration of the semiconductor device 4 is substantially the same as that of the semiconductor device 2 of FIGS. 2 to 5, except the configurations of the device patterns 30a2, 30b2 and 30c2.

In this embodiment, the device patterns 30a2, 30b2 and 30c2 may have first semiconductor layer patterns 31a2, 31b2 and 31c2 and second semiconductor layer patterns 32a2, 32b2 and 32c2 between first electrode lines 10a, 10b and 10c and a second electrode line 20. In an embodiment, the first semiconductor layer patterns 31a2, 31b2 and 31c2 may each be doped to form p-type semiconductor layer patterns, and the second semiconductor layer patterns 32a2, 32b2 and 32c2 may each be doped to form n-type semiconductor layer patterns. In another embodiment, the first semiconductor layer patterns 31a2, 31b2 and 31c2 may each be doped to form n-type semiconductor layer patterns, and the second semiconductor layer patterns 32a2, 32b2 and 32c2 may each be doped to form p-type semiconductor layer patterns. Accordingly, the device patterns 30a2, 30b2 and 30c2 may each be a structure pattern having a pn junction, and may be applied to, for example, a rectifying device or a solar cell.

Figure 8:
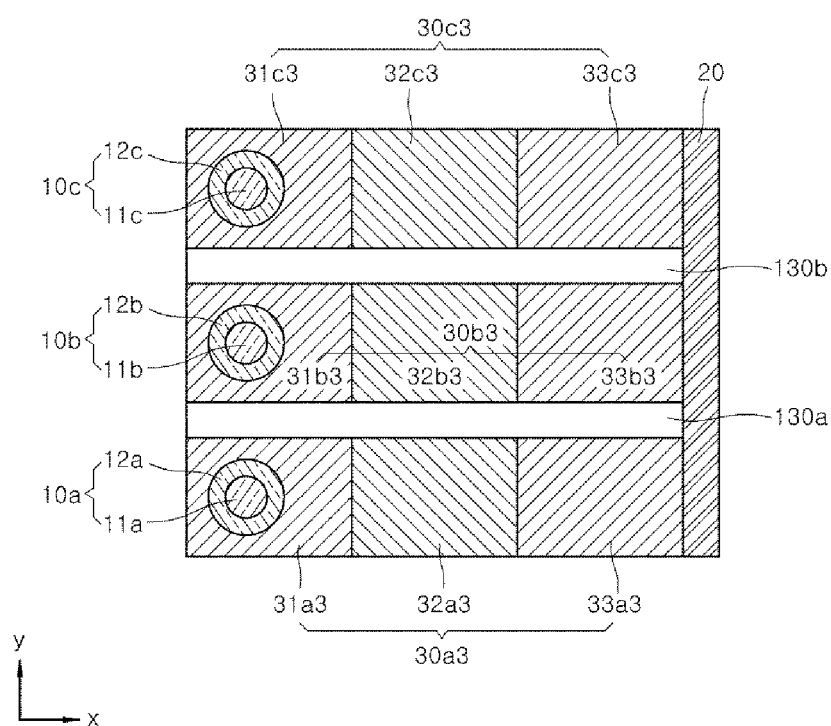
FIG. 8 is a planar perspective view of a semiconductor device having a three-dimensional structure according to yet another embodiment of the present disclosure.

FIG. 8 is a planar perspective view of a semiconductor device 5 having a three-dimensional structure according to yet another embodiment of the present disclosure. Referring to FIG. 8, the configuration of the semiconductor device 5 is substantially the same as that of the semiconductor device 2 of FIGS. 2 to 5, except the configurations of the device patterns 30a3, 30b3 and 30c3.

In this embodiment, the device patterns 30a3, 30b3 and 30c3 may have first semiconductor layer patterns 31a3, 31b3 and 31c3, second semiconductor layer patterns 32a3, 32b3 and 32c3, and third semiconductor layer patterns 33a3, 33b3 and 33c3 between first electrode lines 10a, 10b and 10c and a second electrode line 20, respectively. In an embodiment, the first semiconductor layer patterns 31a3, 31b3 and 31c3 may each be doped to form p-type semiconductor layer patterns, the second semiconductor layer patterns 32a3, 32b3 and 32c3 may each be doped to form n-type semiconductor layer patterns, and the third semiconductor layer patterns 33a3, 33b3 and 33c3 may each be doped to form p-type semiconductor layer patterns. In another embodiment, the first semiconductor layer patterns 31a3, 31b3 and 31c3 may each be doped to form n-type semiconductor layer patterns, the second semiconductor layer patterns 32a3, 32b3 and 32c3 may each be doped to form p-type semiconductor layer patterns, and the third semiconductor layer patterns 33a3, 33b3 and 33c3 may each be doped to form n-type semiconductor layer patterns. Accordingly, the device patterns 30a2, 30b2 and 30c2 may each be a structure pattern having a pnp junction or an npn junction, and may be applied as, for example, a birister-type memory device. In the case of the biristet-type memory device, characteristics in which the resistance changes according to an applied drive voltage can be used for signal storage.

Figure 12:
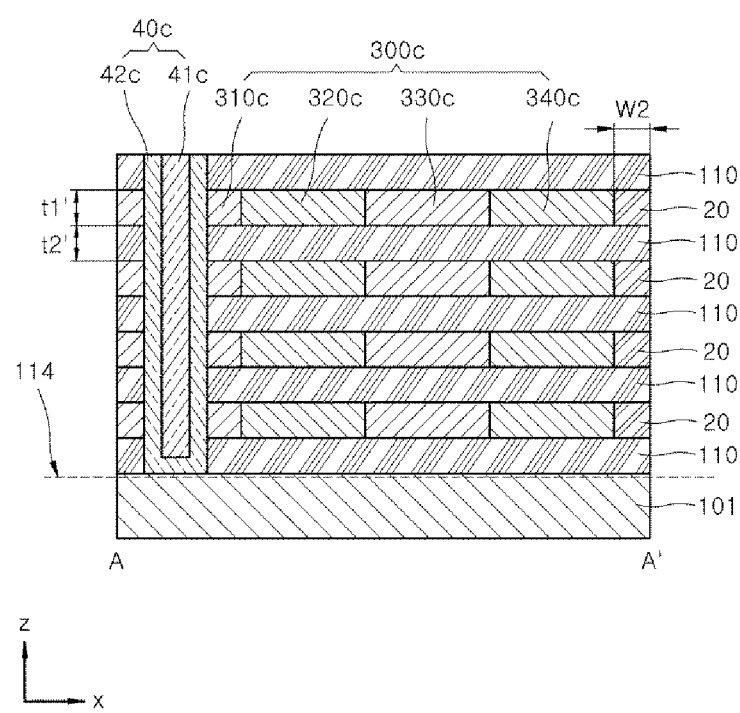
FIG. 12 is a cross-sectional view taken along the line A-A' in the plan view of FIG. 10 and the planar perspective view of FIG. 11.

FIG. 9 is a perspective view schematically illustrating a semiconductor device 6 having a three-dimensional structure according to another embodiment of the present disclosure. FIG. 10 is a plan view of the semiconductor device 6 of FIG. 9. FIG. 11 is a planar perspective view of the same semiconductor device 6 of FIG. 9 when the uppermost interlayer insulating layer 110 is omitted from the semiconductor device 6. FIG. 12 is a cross-sectional view taken along the line A-A' in the plan view of FIG. 10 and the planar perspective view of FIG. 11.

The semiconductor device 6 of a three-dimensional structure illustrated in FIGS. 9 to 12 may be an embodiment of the semiconductor device 1 with reference to FIG. 1. The semiconductor device 6 may include first electrode lines 40a, 40b, 40c, 40d and 40e, device patterns 300a, 300b, 300c, 300d and 300e, interlayer insulating layers 110 and second electrode lines 20. The second electrode line 20 may each have a predetermined width W2 from an end of each of the device patterns 300a, 300b, 300c, 300d and 300e. The device patterns 300a, 300b, 300c, 300d and 300e may each be separated from each other by insulating patterns 132a, 132b, 132c and 132d in a third direction, for example, y-direction. Accordingly, as illustrated in FIG. 11, the device patterns 300a, 300b, 300c, 300d and 300e may constitute device cells C-40a, C-40b, C-40c, C-40d and C-40e that are electrically separated from each other on the same plane. That is, referring to FIGS. 10 and 11, the device cells C-40a, C-40b, C-40c, C-40d and C-40e may each be coupled to the first electrode lines 40a, 40b, 40c, 40d and 40e, respectively, and the device patterns 300a, 300b, 300c, 300d and 300e may each be coupled to a the second electrode line 20, which is a common electrode.

Referring yet to FIGS. 10 and 11, the device cells C-40a, C-40b, C-40c, C-40d and C-40e may each have a width L1' along a third direction, for example, y-direction and a length L2' along a second direction, for example, x-direction. The width L1' may, for example, be about 5 to 300 nanometers (nm). The width L1' may mean a width of the device patterns 300a, 300b, 300c, 300d and 300e located between or adjacent to insulating patterns 132a, 132b, 132c, and 132d. The length L2' may, for example, be about 50 to 1000 nanometers (nm). The length L2' may mean a length from the central axis of each of inner pillar structures 41a, 41b, 41c, 42d and 42e to the second electrode line 20 along the x-direction. Referring to FIGS. 11 and 12, the device cells C-40a, C-40b, C-40c, C-40d and C-40e may each have a thickness t1' and spacing t2' along the first direction, for example, z-direction. The thickness t1' may, for example, be about 5 to 300 nanometers (nm). The spacing t2' may correspond to a thickness of the interlayer insulating layer 110. The spacing t2' may, for example, be about 5 to 300 nanometers (nm).

The configuration of the semiconductor device 6 illustrated in FIGS. 9 to 12 is substantially the same as that of the semiconductor device 5 of FIGS. 2 to 5, except the configurations of the first electrode lines 40a, 40b, 40c, 40d and 40e.

Referring to FIGS. 9 to 12, the first electrode lines 40a, 40b, 40c, 40d and 40e may each include an electrode structure. The electrode structures may include inner pillar structures 41a, 41b, 41c, 41d and 41e and outer wall layers 42a, 42b, 42c, 42d and 42e, respectively.

In this embodiment, the inner pillar structures 41a, 41b, 41c, 41d and 41e and the outer wall layers 42a, 42b, 42c, 42d and 42e may extend along the first direction, for example, z-direction, and at least one end of each of the inner pillar structures 41a, 41b, 41c, 41d and 41e and the outer wall layers 42a, 42b, 42c, 42d and 42e may be disposed in contact with the insulating patterns 132a, 132b, 132c and 132d. Referring to FIG. 10, the inner pillar structures 41a, 41b, 41c, 41d and 41e may each have substantially the same width W3 along the second direction, for example, x-direction. In addition, the outer wall layers 42a, 42b, 42c, 42d and 42e may each have a pair of substantially the same widths W4 and W5 along the second direction, for example, x-direction.

Referring to FIGS. 10 and 12, the inner pillar structures 41a, 41b, 41c, 41d and 41e and the outer wall layers 42a, 42b, 42c, 42d and 42e may be disposed to penetrate the device patterns 300a, 300b, 300c, 300d and 300e and the insulating layer 110 on the substrate 101 and to extend in the first direction, for example, z-direction.

The inner pillar structures 41a, 41b, 41c, 41d and 41e and the outer wall layers 42a, 42b, 42c, 42d and 42e may be formed of substantially the same material as the inner pillar structures 11a, 11b and 11c and the outer wall layers 12a, 12b and 12c described above with reference to FIGS. 2 to 5.

The device patterns 300a, 300b, 300c, 300d and 300e may include first semiconductor layer patterns 310a, 310b, 310c, 310d and 310e, second semiconductor layer patterns 320a, 320b, 320c, 320d and 320e, third semiconductor layer patterns 330a, 330b, 330c, 330d and 330e, and fourth semiconductor layer patterns 340a, 340b, 340c, 340d and 340e, which are sequentially disposed from the first electrode lines 40a, 40b, 40c, 40d and 40e to a second electrode line 20 along the second direction, for example, x-direction parallel to the substrate 101 and perpendicular to the third direction, for example, y-direction, respectively.

The configurations of the first semiconductor layer patterns 310a, 310b, 310c, 310d and 310e, the second semiconductor layer patterns 320a, 320b, 320c, 320d and 320e, the third semiconductor layer patterns 330a, 330b, 330c, 330d and 330e, and the fourth semiconductor layer patterns 340a, 340b, 340c, 340d and 340e may be substantially the same as those of the first semiconductor layer patterns 31a, 31b and 31c, the second semiconductor layer patterns 32a, 32b and 32c, the third semiconductor layer patterns 33a, 33b and 33c, and the fourth semiconductor layer patterns 34a, 34b and 34c described above with reference to FIGS. 2 to 5.

The insulating patterns 132a, 132b, 132c and 132d may be disposed to penetrate the device patterns 300a, 300b, 300c, 300d and 300e and the interlayer insulating layers 110 along the first direction, for example, z-direction over the substrate 101. As described above, the insulating patterns 132a, 132b, 132c and 132d may extend along the second direction, for example, x-direction. The insulating patterns 132a, 132b, 132c and 132d may each, for example, include silicon oxide, silicon nitride, or silicon oxynitride.

As described above, according to various embodiments of the present disclosure, it is possible to implement three-dimensional stack structures including a first conductive line extending in a direction perpendicular to a substrate, for example, z-direction, an interlayer insulating layer stacked to be spaced from each other in a direction perpendicular to the substrate, a device pattern disposed in a space between the interlayer insulating layer and including at least one doped semiconductor layer, and a second conductive line extend in a direction parallel to the substrate, for example, y-direction.

According to various embodiments, methods are provided for fabricating a PNPN or NPNP semiconductor device, such as a thyristor, with minimal defects or difficult-to-predict problems commonly encountered by such devices manufacturing using conventional approaches. More particularly, methods are provided where once the PNPN or NPNP doped layers are form, the layers are not exposed to, for example, an ion etch operation in order to form metal electrodes. Instead, the metal electrodes are form prior to forming the PNPN or NPNP layers or are formed without using, for example, an ion etching process as described herein.

FIGS. 13A, 14A, 15A, 16A, and 17A are plan views schematically illustrating a method of fabricating a semiconductor device having a three-dimensional structure according to an embodiment of the present disclosure. FIGS.

13B, 14B, 15B, 16B, and 17B are cross-sectional views further illustrating the method of fabricating the semiconductor device schematically illustrated in FIGS. 13A, 14A, 15A, 16A, and 17A.

Figure 13A:
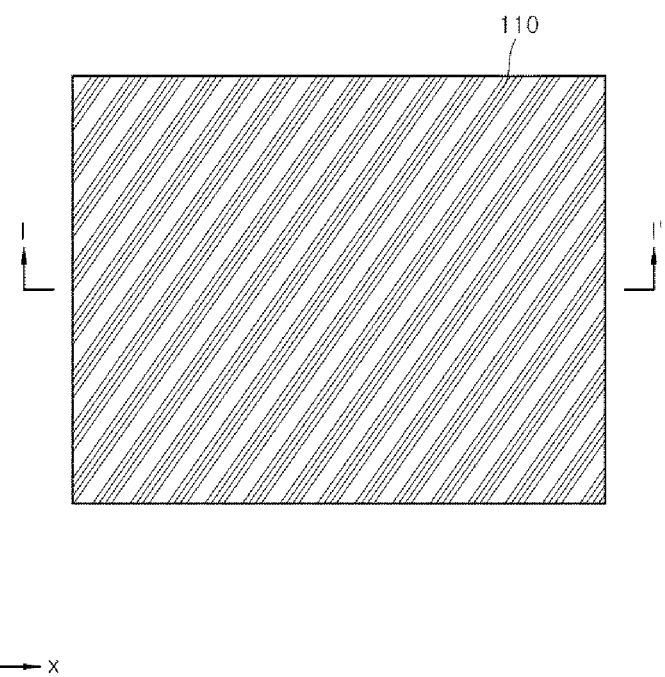
FIGS. 13A, 14A, 15A, 16A, and 17A are plan views schematically illustrating a method of manufacturing a semiconductor device having a three-dimensional structure according to an embodiment of the present disclosure.
Figure 13B:
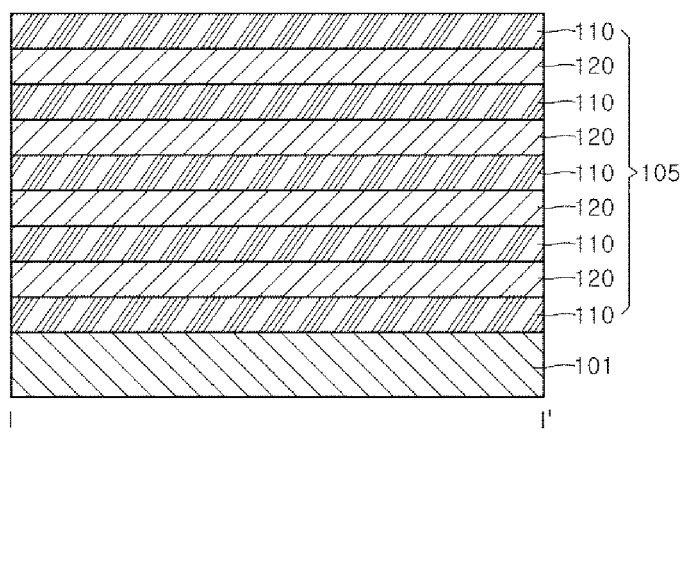
FIGS. 13B, 14B, 15B, 16B, and 17B are cross-sectional views further illustrating the method of manufacturing the semiconductor device schematically illustrated in FIGS. 13A, 14A, 15A, 16A, and 17A.

Referring to FIGS. 13A and 13B, a substrate 101 may be provided. The substrate 101 may, for example, include a semiconductor material. The substrate 101 may, for example, be a silicon (Si) substrate, a gallium arsenic (GaAs) substrate, an indium phosphide (InP) substrate, a germanium (Ge) substrate, or a silicon germanium (SiGe) substrate. In some embodiments, the substrate 101 may be a doped substrate, such as an n-type or p-type substrate having conductivity. In another embodiment, the substrate 101 may be an insulative substrate like a silicon-on-insulator (SOI) substrate. In yet another embodiment, the substrate 101 may be a conductive substrate like a metal substrate.

Then, a stack structure 105 may be formed by alternately stacking interlayer insulating layers 110 and sacrificial layers 120 on the substrate 101. At this time, the lowermost layer of the stack structure 105 (as shown in FIG. 13B), which is in contact with the substrate 101, may be the interlayer insulating layer 110. The interlayer insulating layer 110 and sacrificial layer 120 may have etch selectivity with respect to each other. As an example, the interlayer insulating layer 110 may include oxide, and the sacrificial layer 120 may include nitride. As another example, the interlayer insulating layer 110 may include nitride, and the sacrificial layer 120 may include oxide. At this time, the number of the interlayer insulating layers 110 and the number of the sacrificial layers 120 may not be limited. The interlayer insulating layers 110 may each have a thickness of, for example, about 5 to 300 nanometers (nm). The sacrificial layers 120 may each have a thickness of, for example, about 5 to 300 nanometers (nm).

Figure 14A:
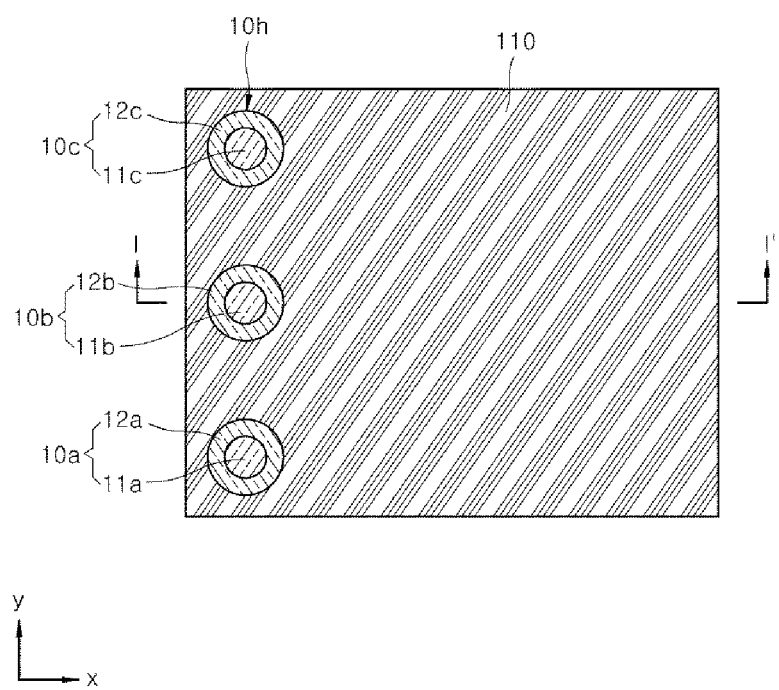
Figure 14B:
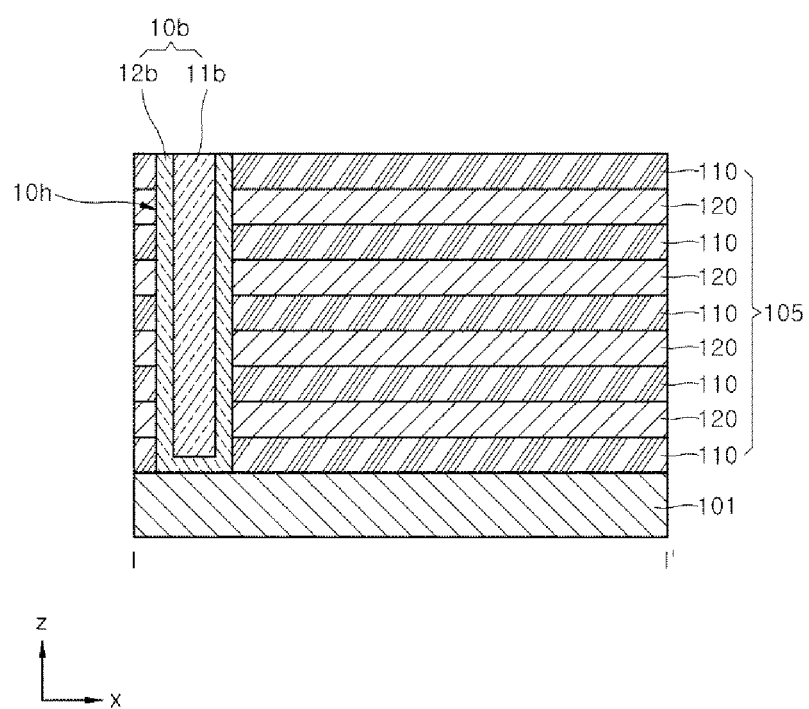

Referring to FIGS. 14A and 14B, through holes 10h may be formed to penetrate the stack structure 105 on the substrate 101. A plurality of the through holes 10h may be arranged apart from each other along a third direction parallel to the substrate 101, for example, y-direction. A seed semiconductor layer of a predetermined thickness may be formed on the side surface and the bottom surface of each of the through holes 10h. The seed semiconductor layer may include an intrinsic semiconductor material. Alternatively, the seed layer may include an n-type or a p-type doped semiconductor material. The seed semiconductor layer may, for example, include silicon (Si), gallium arsenic (GaAs), indium phosphide (InP), germanium (Ge), silicon germanium (SiGe), gallium nitride (GN) or the like. The seed semiconductor layer may, for example, be formed by a chemical vapor deposition method or an atomic layer deposition method.

Subsequently, the through holes 10h in which the seed semiconductor layer is formed may be filled with a conductive material. At this time, the conductive material may have lower resistivity than the seed semiconductor layer. The conductive material may, for example, include tungsten (W), titanium (Ti), molybdenum (Mo), cobalt (Co), ruthenium (Ru), copper (Cu), aluminum (Al), tungsten nitride, titanium nitride, tantalum nitride, tungsten silicide, titanium silicide, tantalum silicide or the like. The conductive material may, for example, be formed by a chemical vapor deposition method or an atomic layer deposition method. After forming the seed semiconductor layer and the conductive material, a planarization process may be performed. As a result, the upper surfaces of the seed semiconductor layer and conductive material may be located on the same plane as the upper surface of the uppermost interlayer insulating layer 110 as illustrated in FIG. 14B.

Through the above-described processes, the first electrode lines 10a, 10b and 10c, which are columnar electrode structures extending in a first direction, for example, z-direction perpendicular to the substrate 101 (e.g., perpendicular to a substrate plane 114 defined by substrate 101), can be formed. The seed semiconductor layer may form outer wall layers 12a, 12b and 12c of the first electrode lines 10a, 10b and 10c, and the conductive material may form inner columnar structures of the first electrode lines 10a, 10b and 10c.

In some other embodiments, after forming the seed semiconductor layer of a predetermined thickness on the side surface and the bottom surface of the through holes 10h, the through holes 10h in which the seed semiconductor layers are formed may be filled with an insulative material having etch selectivity with respect to the seed semiconductor layer. Then, the insulative material layer may be etched and removed to form holes exposing the seed semiconductor layer. Subsequently, the inner pillar structures 11a, 11b, and 11c can be formed by providing a conductive material on the seed semiconductor layer of the holes to fill the holes.

Figure 15A:
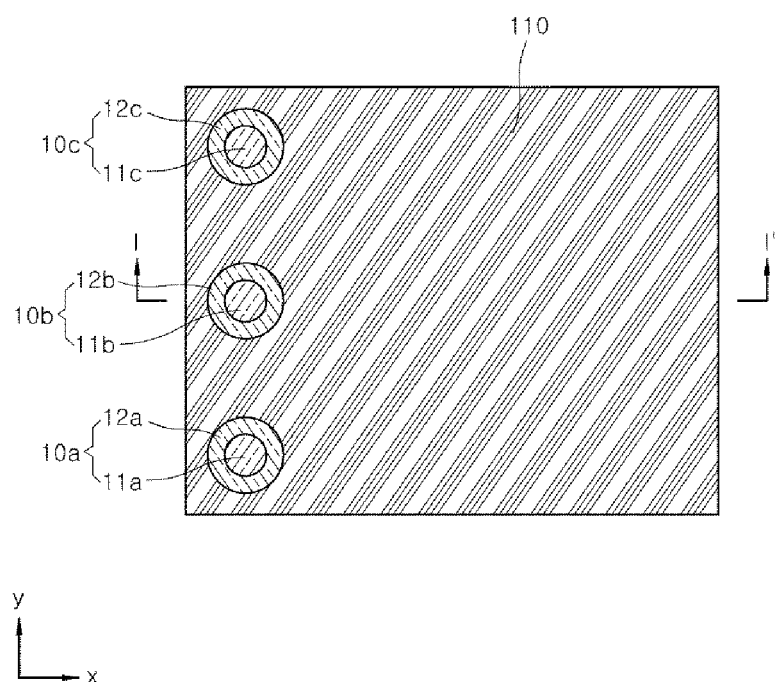
Figure 15B:
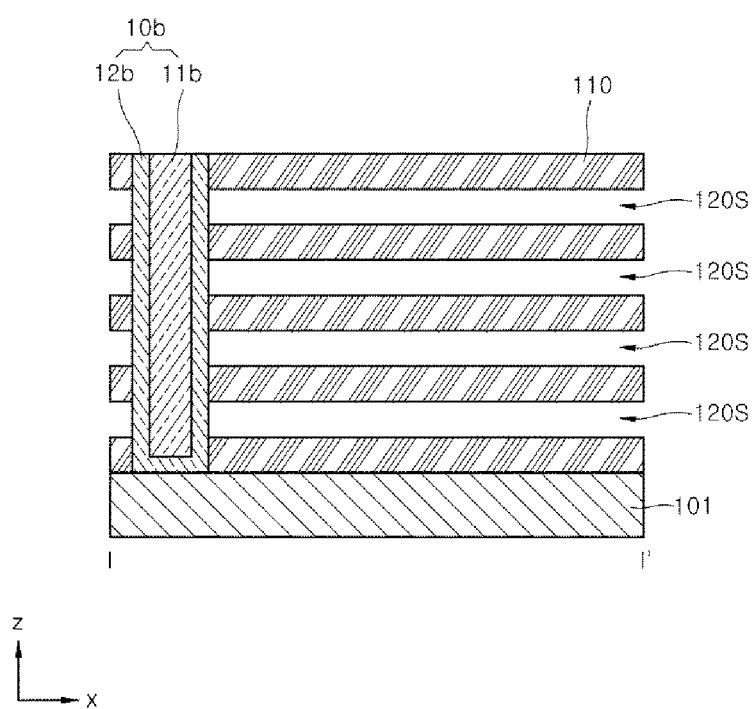

Referring to FIGS. 15A and 15B, the sacrificial layers 120 may be selectively removed on the substrate 101 to form recessed spaces 120S exposing the side surfaces of the first electrode lines 10. At this time, the outer wall layers 12a, 12b and 12c of the first electrode lines 10 may be exposed. In an embodiment, the sacrificial layers 120 may be selectively removed by a wet etch method using the etch selectivity of the sacrificial layer 120 and the interlayer insulating layer 110 with respect to a predetermined etch solution.

Figure 16A:
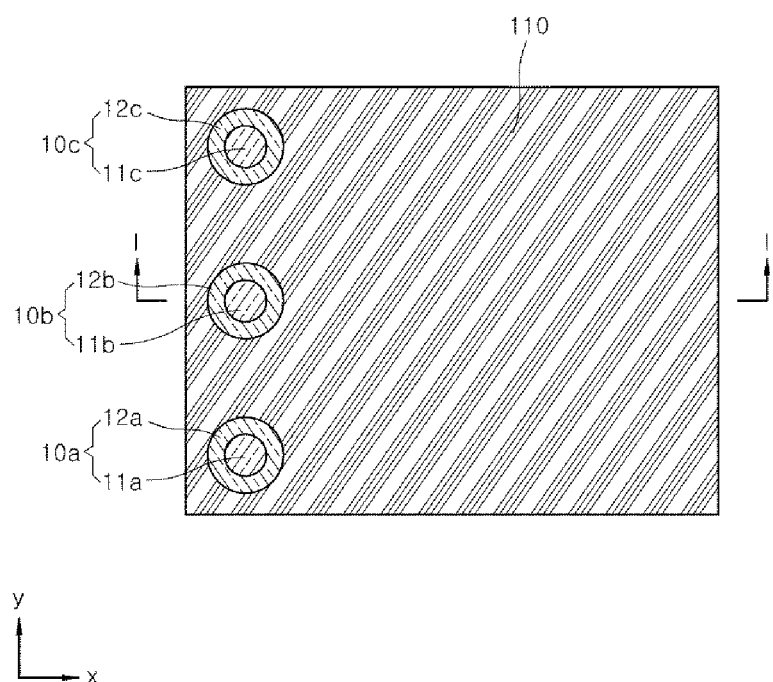
Figure 16B:
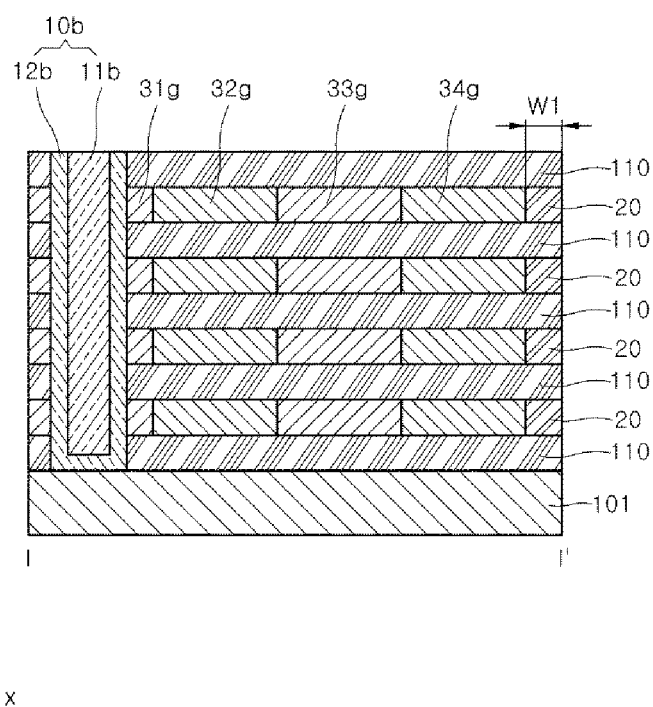

Referring to FIGS. 16A and 16B, at least one doped semiconductor layer may be sequentially grown in the recessed spaces 120S in a direction parallel to the substrate 101 (e.g., parallel to the substrate plane 114), that is, the second direction, for example, x-direction and the third direction, for example, y-direction using the exposed outer wall layers 12a, 12b and 12c as seed layers. In other words, the at least one doped semiconductor layer may be grown from the seed semiconductor layers of the outer wall layers 12a, 12b and 12c located at side surfaces of the first electrode lines 10. In an embodiment, the at least one doped semiconductor layer may be sequentially grown by selective epitaxial growth (SEG).

Referring to FIGS. 16A and 16B, first semiconductor layers 31g, second semiconductor layers 32g, third semiconductor layers 33g and fourth semiconductor layers 34g may be sequentially grown from the outer wall layers 12a, 12b and 12c as the at least one doped semiconductor layer.

In an embodiment, the first semiconductor layers 31g may be doped to be p-type semiconductor layers, the second semiconductor layers 32g may be doped to be n-type semiconductor layers, the third semiconductor layers 33g may be doped to be p-type semiconductor layers, and the fourth semiconductor layers 34g may be doped to be n-type semiconductor layers. Accordingly, the first semiconductor layers 31g, the second semiconductor layers 32g, the third semiconductor layers 33g and the fourth semiconductor layers 34g may form pnpn junctions. In another embodiment, the first semiconductor layers 31g may be doped to be n-type semiconductor layers, the second semiconductor layers 32g may be doped to be p-type semiconductor layers, the third semiconductor layers 33g may be doped to be n-type semiconductor layers, and the fourth semiconductor layers 34g may be doped to be p-type semiconductor layers. Accordingly, the first semiconductor layers 31g, the second semiconductor layers 32g, the third semiconductor layers 33g and the fourth semiconductor layers 34g may form npnp junctions.

In some other embodiments not illustrated, a single semiconductor layer may be grown from the outer wall layers 12a, 12b and 12c of the first electrode lines 10, respectively. For these embodiments, the single semiconductor layer may be doped to be p-type or n-type semiconductor layer. In some other embodiments, a p-type doped first semiconductor layer and an n-type doped second semiconductor layer may be grown from the outer wall layers 12a, 12b and 12c of the first electrode lines 10, or an n-type doped first semiconductor layer and a p-type doped second semiconductor layer may be grown from the outer wall layers 12a, 12b and 12c of the first electrode lines 10. Accordingly, two semiconductor layers, that is, the first semiconductor layer and the second semiconductor layer may form a pn junction.

In some other embodiments not illustrated, three semiconductor layers may be grown from the outer wall layers 12a, 12b and 12c of the first electrode lines 10, respectively. The three semiconductor layers may be a p-type doped first semiconductor layer, an n-type doped second semiconductor layer, and a p-type doped third semiconductor layer that are sequentially disposed from the outer wall layers 12a, 12b and 12c of the first electrode lines 10. Alternatively, the three semiconductor layers may be an n-type doped first semiconductor layer, a p-type doped second semiconductor layer, and an n-type doped third semiconductor layer that are sequentially disposed from the outer wall layers 12a, 12b and 12c of the first electrode lines 10. Accordingly, the first to third semiconductor layers may form a pnp junction or an npn junction.

Referring again to FIGS. 16A and 16B, the growth of the first to fourth semiconductor layers 31g, 32g, 33g and 34g in the x-direction and the y-direction can be controlled by controlling the process time of the selective epitaxial growth method. That is, the first semiconductor layer 31g may be grown for a predetermined first process time, and the second to fourth semiconductor layers 32g, 33g and 34g may be sequentially grown for predetermined second to fourth process times, respectively to control the thicknesses of the first to fourth semiconductor layers 31g, 32g, 33g and 34g.

Referring to FIGS. 15B and 16B, the selective epitaxial growth may be terminated before the first to fourth semiconductor layers 31g, 32g, 33g and 34g fill the recessed spaces 120S. That is, after growing the fourth semiconductor layers 34g for the predetermined fourth process time, the selective epitaxial growth may be terminated. Then, after the fourth semiconductor layers 34g are grown, conductive material layers may be formed in the remaining recessed spaces 120S. Accordingly, the conductive material layers may each be formed to have a predetermined width W1 from one end of each of the fourth semiconductor layers 34g, as illustrated. The conductive material layers may be formed to extend in the third direction, for example, y-direction perpendicular to the second direction, for example, x-direction. As a result, the second electrode lines 20 can be formed.

The conductive material layer may, for example, include tungsten (W), titanium (Ti), molybdenum (Mo), cobalt (Co), ruthenium (Ru), copper (Cu), aluminum (Al), tungsten nitride, titanium nitride, tantalum nitride, tungsten silicide, titanium silicide, tantalum silicide or the like. The conductive material layer may, for example, be formed by a chemical vapor deposition method or an atomic layer deposition method.

Though not illustrated, in some other embodiments, the conductive material layer may be additionally formed outside the recessed spaces 120S after filling the recessed spaces 120S. In this case, a known isotropic etching process or an anisotropic etching process may be further performed to remove the additional conductive material layer formed outside the recessed spaces 120S.

Figure 17A:
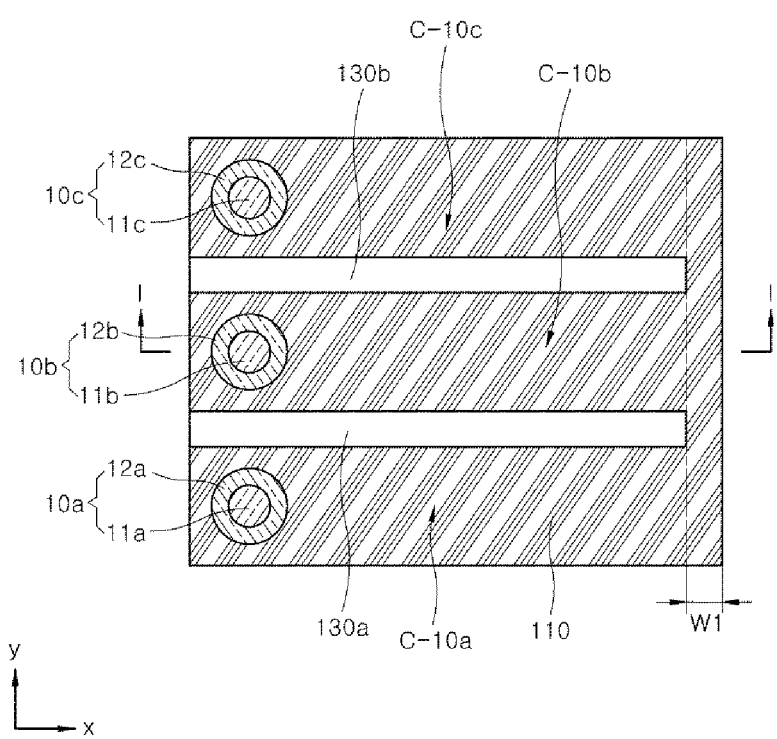
Figure 17B:
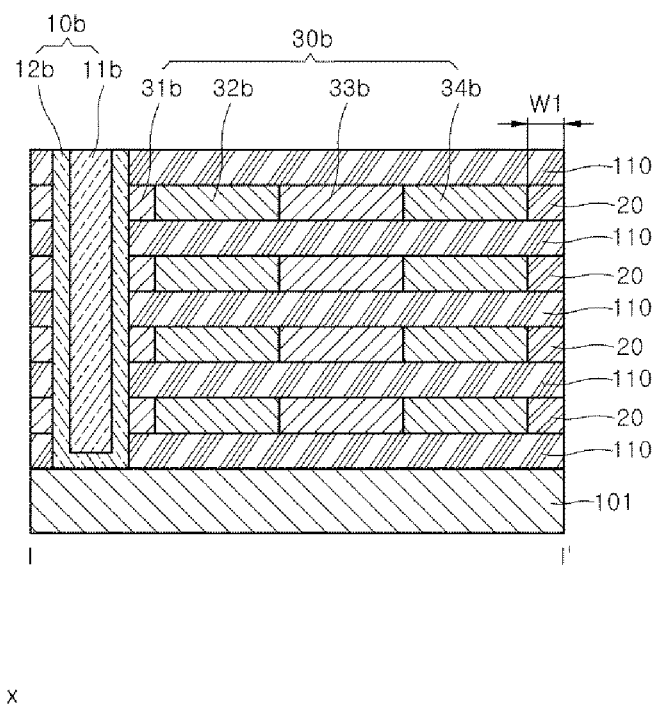

Referring to FIGS. 17A and 17B, the at least one doped semiconductor layers 31g, 32g, 33g and 34g and the interlayer insulating layers 110 may be patterned along the first direction, for example, z-direction to form trench patterns. At this time, the second electrode lines 20 and the interlayer insulating layers 110 located immediately above and below the second electrode lines 20 may not be patterned. As illustrated in FIG. 17A, the trench patterns may be disposed between the first electrode lines 10a, 10b and 10c. In addition, the trench patterns may extend in the second direction, for example, x-direction.

Next, the trench patterns may be filled with an insulating material to form insulating patterns 130a and 130b. The at least one doped semiconductor layers 31g, 32g, 33g and 34g may be divided into three device cells by the insulating patterns 130a and 130b. As a result, as described above with reference to FIG. 4, three device cells C-10a, C-10b and C-10c can be formed. The device cells C-10a, C-10b and C-10c may include corresponding device patterns 30a, 30b and 30c, respectively. The device patterns 30a, 30b and 30c may include corresponding first semiconductor layer patterns 31a, 31b, 31c and 31d, second semiconductor layer patterns 32a, 32b, 32c and 32d, third semiconductor layer patterns 33a, 33b, 33c and 33d, and fourth semiconductor layer patterns 34a, 34b, 34c and 34d, respectively. Note that these semiconductor layer patterns may be doped semiconductor layer patterns.

The semiconductor device having three-dimensional structure according to an embodiment of the present disclosure can be fabricated by performing the above-described processes. According to the embodiment of the present disclosure, after at least one doped semiconductor layer is sequentially formed by selective epitaxial growth in the recessed space, a second electrode line can be formed to contact the at least one doped semiconductor layer in the remaining recessed space. Thereafter, only the at least one doped semiconductor layer is patterned to form the semiconductor device.

In this embodiment, no physical and chemical damage can be generated at an interface between the at least one doped semiconductor layer and the second electrode line during the patterning, and thus, the interface characteristics of the at least one doped semiconductor layer and the second electrode line can be improved.

FIGS. 18A, 19A, 20A, 21A, and 22A are plan views schematically illustrating a method of fabricating a semiconductor device having a three-dimensional structure according to another embodiment of the present disclosure. FIGS. 18B, 19B, 20B, 21B, and 22B are cross-sectional views further illustrating the method of fabricating the semiconductor device schematically illustrated in FIGS. 18A, 19A, 20A, 21A, and 22A.

Figure 18A:
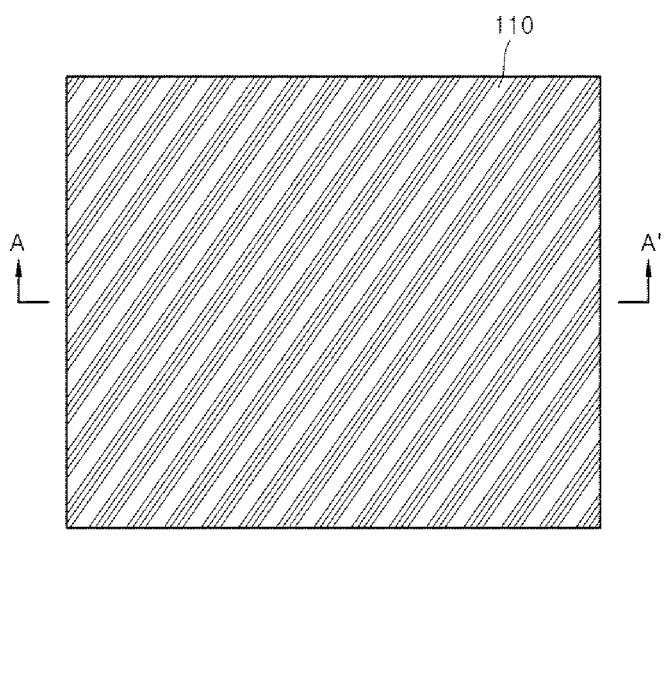
FIGS. 18A, 19A, 20A, 21A, and 22A are plan views schematically illustrating a method of fabricating a semiconductor device having a three-dimensional structure according to an embodiment of the present disclosure.
Figure 18B:
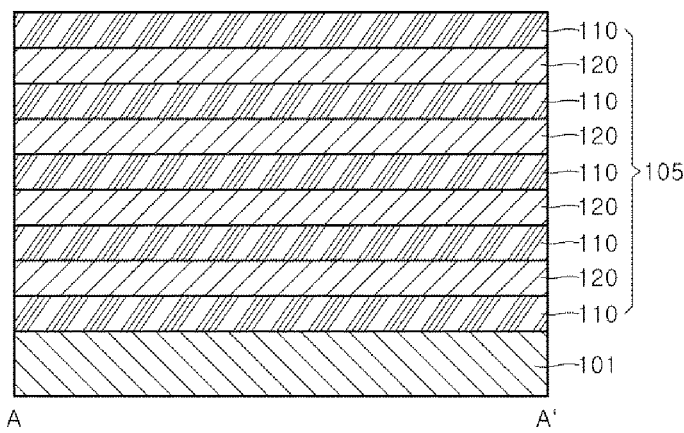
FIGS. 18B, 19B, 20B, 21B, and 22B are cross-sectional views further illustrating the method of fabricating the semiconductor device schematically illustrated in FIGS. 18A, 19A, 20A, 21A, and 22A.

Referring to FIGS. 18A and 18B, a substrate 101 may be provided. Then, a stack structure 105 may be formed by alternately stacking interlayer insulating layers 110 and sacrificial layers 120 on the substrate 101. The process of forming the stack structure 105 on the substrate 101 may be substantially the same as the process described above in connection with FIGS. 13A and 13B.

Figure 19A:
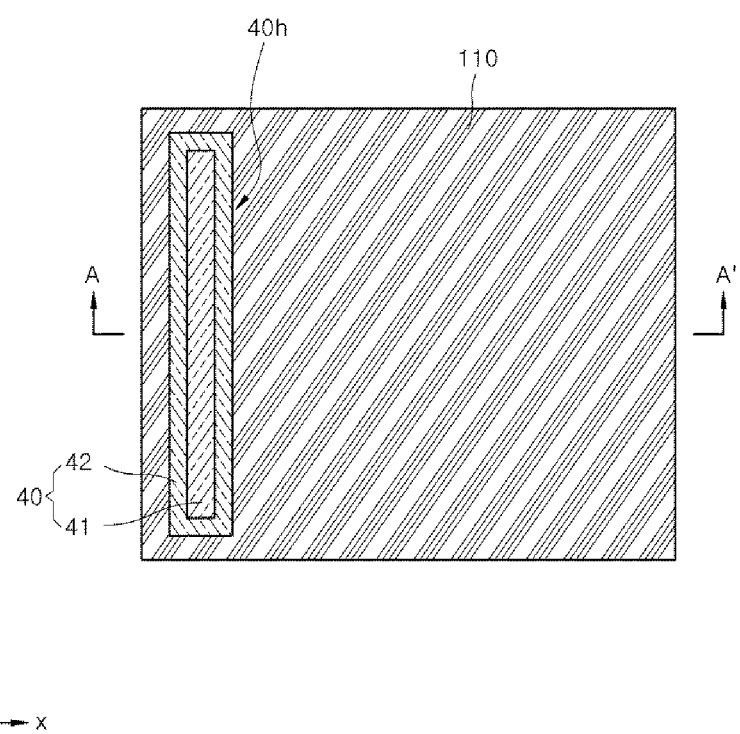
Figure 19B:
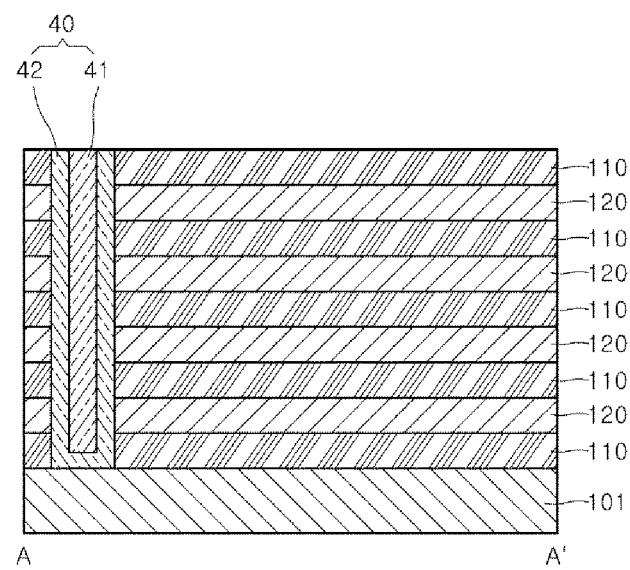

Referring to FIGS. 19A and 19B, a trench hole 40h may be formed to penetrate the stack structure 105 on the substrate 101. The trench hole 40h may extend in a first direction, for example, z-direction perpendicular to the substrate 101, and a third direction, for example, y-direction parallel to the substrate 101. The trench hole 40h may be formed by selectively etching the interlayer insulating layers 110 and the sacrificial layers 120 on the substrate 101.

Next, a seed semiconductor layer of a predetermined thickness may be formed on a side surface and a bottom surface of the trench hole 40h. The configuration of the seed semiconductor layer may be substantially the same as that of the seed semiconductor layer of the embodiment described above with reference to FIGS. 14A and 14B. Next, the trench hole 40h in which the seed semiconductor layer is formed may be filled with a conductive material. At this time, the conductive material may have lower resistivity than the seed semiconductor layer. The conductive material may be substantially the same as the conductive material of the embodiment described above with reference to FIGS. 14A and 14B. Accordingly, a trench electrode structure 40 extending in the first direction, for example, z-direction perpendicular to the substrate 101 (e.g., perpendicular to the substrate plane 114), and the third direction for example, y-direction parallel to the substrate 101 (e.g., parallel to the substrate plane 114) can be formed. The trench electrode structure 40 may include an inner structure 41 and an outer thin film 42. The inner structure 41 and the outer thin film 42 may have the same configurations as the inner pillar structure and the outer wall layer of the embodiment described above with reference to FIGS. 14A and 14B.

In some other embodiments, after forming the seed semiconductor layer of a predetermined thickness on the side surface and the bottom surface of the trench hole 40h, the trench hole 40h may be filled with an insulative material having etch selectivity with respect to the seed semiconductor layer. Then, the insulative material may be etched and removed to form a second trench hole exposing the seed semiconductor layer. Subsequently, the conductive material may be provided on the seed semiconductor layer of the trench hole to fill the second trench hole, thereby forming the inner pillar structure.

Figure 20A:
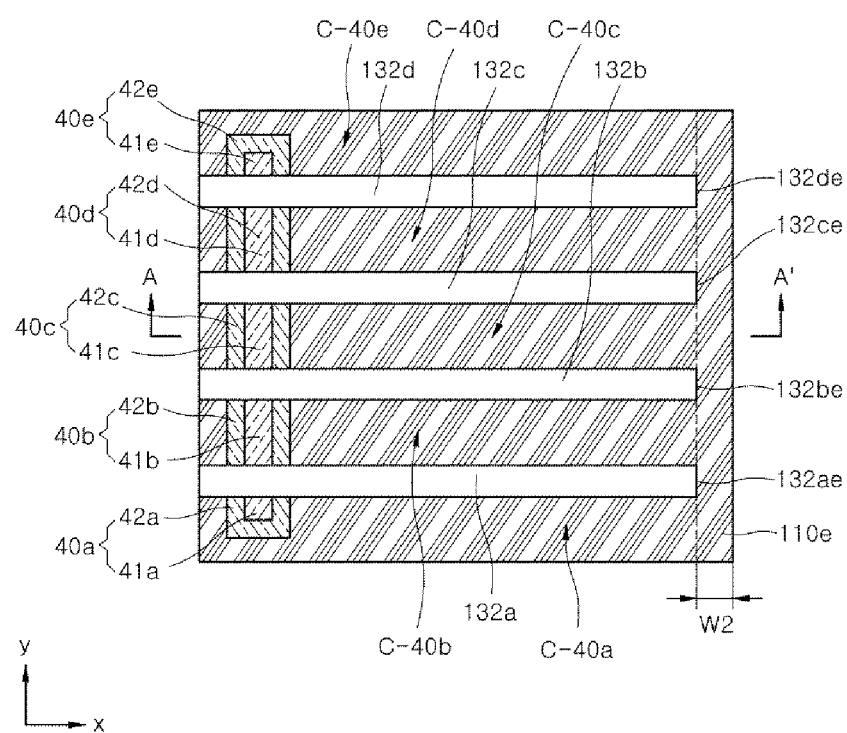
Figure 20B:
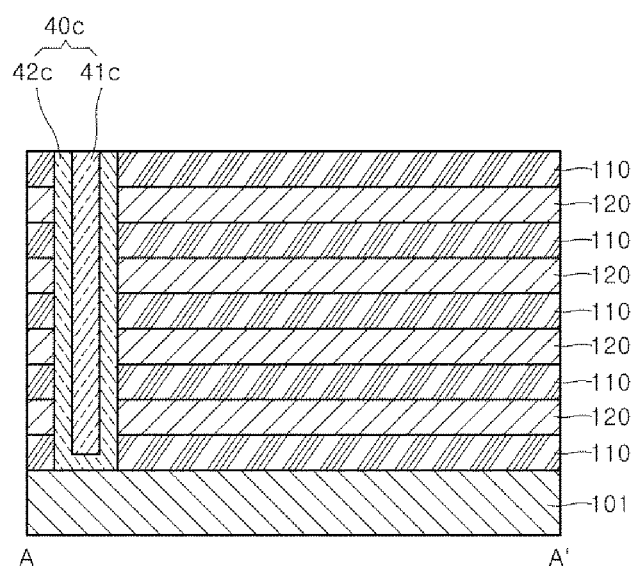

Referring to FIGS. 20A and 20B, insulating patterns 132a, 132b, 132c and 132d may be formed to penetrate the trench electrode structure 40, the interlayer insulating layers 110 and the sacrificial layers 120 on the substrate 101. The insulating patterns 132a, 132b, 132c and 132d may extend in the first direction, for example, z-direction and the second direction, for example, x-direction. Portions of the trench electrode structure 40 can be spatially separated by the insulating patterns 132a, 132b, 132c and 132d in a third direction, for example, y-direction perpendicular to the second direction, for example, x-direction to form a plurality of first electrode lines 40a, 40b, 40c, 40d and 40e. The plurality of first electrode lines 40a, 40b, 40c, 40d and 40e may each include corresponding inner pillar structures 41a, 41b, 41c, 41d and 41e, and outer wall layers 42a, 42b, 42c, 42d and 42e surrounding the inner pillar structures 41a, 41b, 41c, 41d and 41e, respectively.

Referring to FIG. 20A, each one end of the insulating patterns 132ae, 132be, 132ce and 132de of the insulating patterns 132a, 132b, 132c and 132d extending in the second direction, for example, x-direction may be located to be spaced apart from each one end 110e of the interlayer insulating layers 110 by a predetermined width W2. Accordingly, second electrode lines 20 each having a width corresponding to the predetermined width W2 can be formed by the process related to FIGS. 21A, 21B, 22A and 22B described later.

The insulating patterns 132a, 132b, 132c and 132d may define regions of device cells C-40a, C-40b, C-40c, C-40d and C-40e. Through a process related to FIGS. 21A, 21B, 22A, and 22B described later, at least one doped semiconductor layer may be formed for each of the device cells C-40a, C-40b, C-40c, C-40d and C-40e. Accordingly, a plurality of device cells C-40a, C-40b, C-40c, C-40d and C-40e electrically separated from each other can be implemented.

Figure 21A:
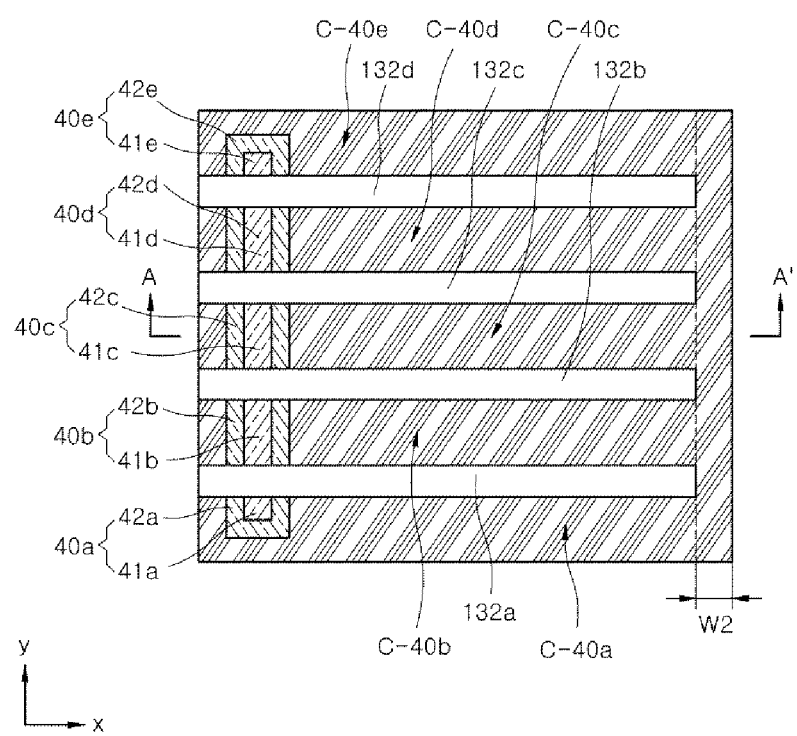
Figure 21B:
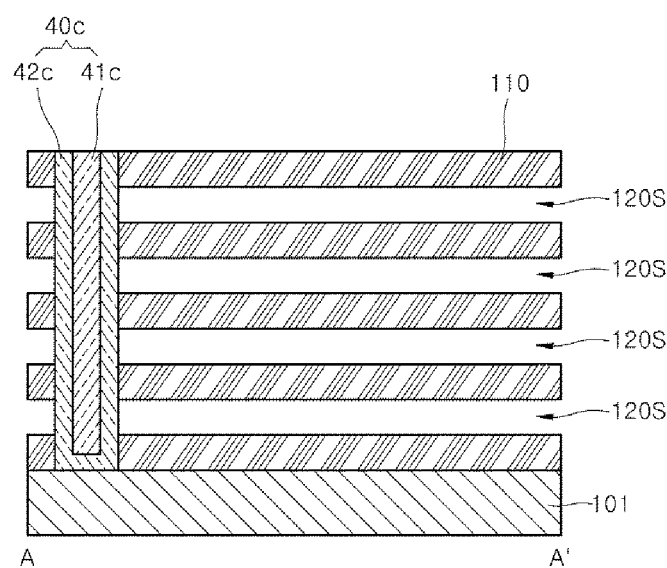

Referring to FIGS. 21A and 21B, the sacrificial layers 120 on the substrate 101 may be selectively removed to form recessed spaces 120S exposing side surfaces of the first electrode lines 40a, 40b, 40c, 40d and 40e. At this time, the outer wall layers 42a, 42b, 42c, 42d and 42e of the first electrode lines 40a, 40b, 40c, 40d and 40e may be exposed. The sacrificial layers 120 may be removed using the substantially same process of removing the sacrificial layers 120 described above with reference to FIGS. 15A and 15B.

Figure 22A:
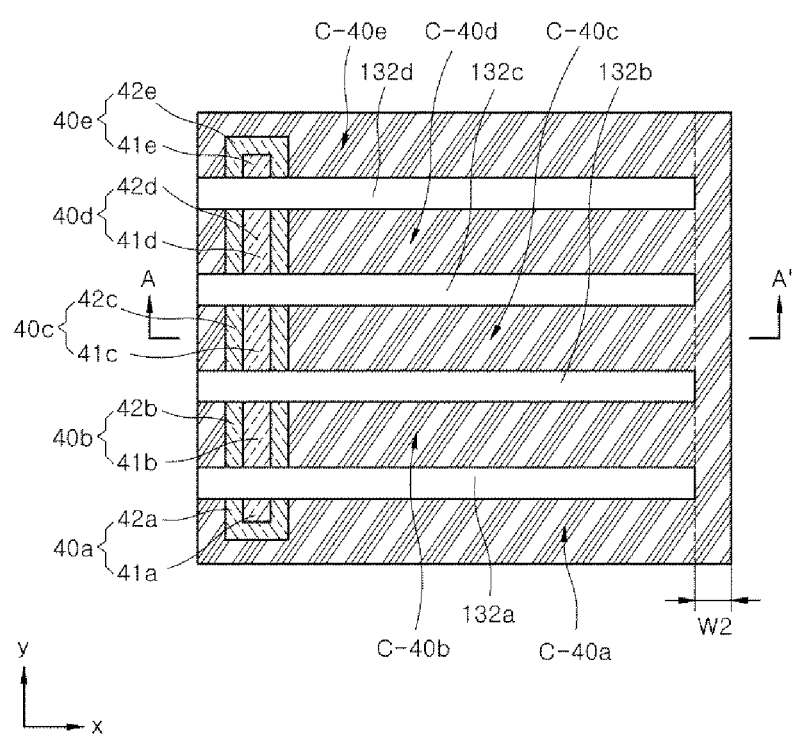
Figure 22B:
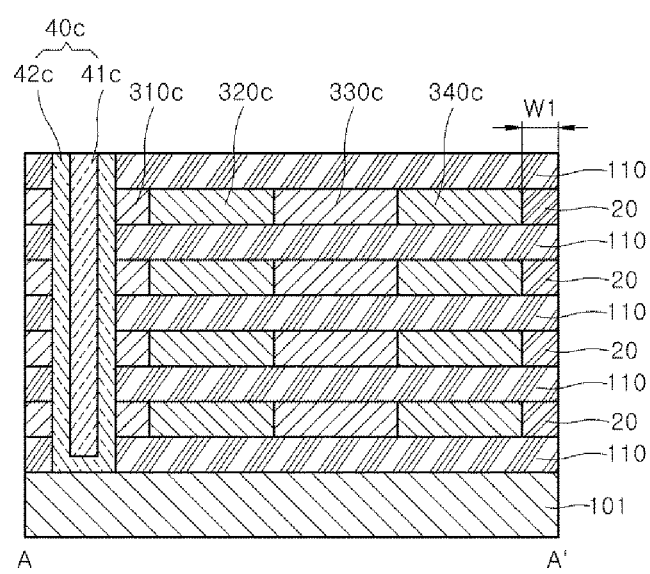

Referring to FIGS. 22A and 22B, at least one doped semiconductor layer may be sequentially grown in each of the recessed spaces 120S in a direction parallel to the substrate 101 (e.g., parallel to the substrate plane 114), that is, the second direction, for example, x-direction and the third direction, for example, y-direction using the exposed outer wall layers 42a, 42b, 42c, 42d and 42e as seed layers. The at least one doped semiconductor layer may be grown by applying the selective epitaxial growth method described above with reference to FIGS. 16A and 16B. At this time, the selective epitaxial growth can be terminated by controlling the growth of the at least one doped semiconductor layer before filling the recessed spaces 120S. Next, a conductive material layer may be formed to contact the at least one doped semiconductor layer in the remaining recessed spaces 120S to form the second electrode lines 20. The configuration and forming method of the conductive material layer may be substantially the same as those of the conductive material layer described above with reference to FIGS. 16A and 16B.

Although not illustrated, in some other embodiments, the conductive material layer may further be formed outside the recessed spaces 120S after filling the recessed spaces 120S. In this case, a known isotropic etching process or an anisotropic etching process may be further performed to remove the additional conductive material layer formed outside the recessed spaces 120S. As a result, the resulting semiconductor device manufactured using this method, as shown in FIG. 22B is substantially the same as the semiconductor device 6 described above with reference to FIGS. 9 to 12.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A semiconductor device having a three-dimensional structure, semiconductor device comprising:
   a substrate;
   a first electrode line extending in a first direction perpendicular to the substrate;
   a device pattern extending from the first electrode line in a second direction parallel to the substrate; and
   a second electrode line connected to the device pattern, wherein the device pattern comprises at least one semiconductor layer pattern, the at least one semiconductor layer pattern comprising an n-type dopant or a p-type dopant, and wherein the second electrode line extends in a third direction that is not parallel to the first electrode line.

2. The semiconductor device of claim 1,
wherein the first electrode line comprises:
an inner pillar structure; and
an outer wall layer surrounding the inner pillar structure.

3. The semiconductor device of claim 2,
wherein the outer wall layer comprises a semiconductor material, and
wherein the inner pillar structure comprises a conductive material having lower resistivity than the outer wall layer.

4. The semiconductor device of claim 1,
wherein the device pattern is formed of a semiconductor layer pattern that was doped to form a p-type or n-type semiconductor layer pattern.

5. The semiconductor device of claim 1,
wherein the device pattern comprises a first semiconductor layer pattern that was doped to form a p-type semiconductor layer pattern and a second semiconductor layer pattern that was doped to form an n-type semiconductor layer pattern.

6. The semiconductor device of claim 1,
wherein the device pattern comprises a first semiconductor layer pattern that was doped to form a p-type semiconductor layer pattern, a second semiconductor layer pattern that was doped to form an n-type semiconductor layer pattern, a third semiconductor layer pattern that was doped to form a p-type semiconductor layer pattern and a fourth semiconductor layer pattern that was doped to form an n-type semiconductor layer pattern, which are sequentially disposed along the device pattern, or comprises a first semiconductor layer pattern that was doped to form an n-type semiconductor layer pattern, a second semiconductor layer pattern that was doped to form a p-type semiconductor layer pattern, a third semiconductor layer pattern that was doped to form an n-type semiconductor layer pattern and a fourth semiconductor layer pattern that was doped to form an p-type semiconductor layer pattern, which are sequentially disposed along the device pattern.

7. The semiconductor device of claim 1,
wherein the second electrode line is parallel to the substrate and extends in the third direction perpendicular to the second direction.

8. A semiconductor device having a three-dimensional structure, the semiconductor device comprising:
a substrate;
first electrode lines extending in a first direction perpendicular to the substrate;
device patterns and interlayer insulating layers, which are alternately stacked on the substrate in the first direction; and
second electrode lines disposed on the same plane as the device patterns,
wherein the device patterns extend from the first electrode lines in a second direction parallel to the substrate and are connected to the second electrode lines, each of the device patterns comprising at least one doped semiconductor layer pattern, and
wherein the second electrode lines extend in a third direction that is not parallel to the first electrode lines.

9. The semiconductor device of claim 8,
wherein the second electrode lines are parallel to the substrate and extend to the third direction perpendicular to the second direction.

10. The semiconductor device of claim 9,
wherein the first electrode lines are arranged spaced apart from each other along a third direction that is parallel to the substrate and perpendicular to the second direction.

11. The semiconductor device of claim 10, further comprising:
insulating patterns isolating the device patterns adjacent to each other along the third direction, and extending in the second direction.

12. The semiconductor device of claim 10,
wherein each of the first electrode lines comprises:
an inner pillar structure; and
an outer wall layer surrounding the inner pillar structure,
the inner pillar structure comprising a conductive material having lower resistivity than the outer wall layer.

13. The semiconductor device of claim 12,
wherein each of the device patterns comprises a diode device pattern doped to form a p-type diode device pattern or an n-type diode device pattern.

14. The semiconductor device of claim 12,
wherein each of the device patterns comprises a plurality of semiconductor layer patterns having at least one pn junction from the first electrode lines to the second electrode lines.

* * * * *